US008102463B2

(12) United States Patent
Komaba et al.

(10) Patent No.: US 8,102,463 B2
(45) Date of Patent: Jan. 24, 2012

(54) SOLID-STATE IMAGE DEVICE HAVING FOCUS DETECTION PIXELS

(75) Inventors: Takafumi Komaba, Sagamihara (JP); Tadashi Narui, Sagamihara (JP)

(73) Assignee: Nixon Corporation, Tokyo (JP)

( * ) Notice: Subject to any disclaimer, the term of this patent is extended or adjusted under 35 U.S.C. 154(b) by 535 days.

(21) Appl. No.: 12/285,109

(22) Filed: Sep. 29, 2008

(65) Prior Publication Data

US 2009/0086084 A1 Apr. 2, 2009

Related U.S. Application Data

(60) Provisional application No. 60/960,498, filed on Oct. 1, 2007.

(30) Foreign Application Priority Data

Oct. 1, 2007 (JP) ................................. 2007-257572

(51) Int. Cl.
*H04N 5/335* (2006.01)
*H04N 5/232* (2006.01)

(52) U.S. Cl. ........................................ 348/349; 348/302

(58) Field of Classification Search .................. 348/345, 348/349, 350, 302, 304
See application file for complete search history.

(56) References Cited

U.S. PATENT DOCUMENTS

| 6,781,632 | B1 * | 8/2004 | Ide ................................. | 348/345 |
| 6,829,008 | B1 | 12/2004 | Kondo et al. | |
| 6,838,651 | B1 * | 1/2005 | Mann ........................ | 250/208.1 |
| 6,906,751 | B1 * | 6/2005 | Norita et al. .................. | 348/349 |
| 7,088,395 | B2 * | 8/2006 | Takayama et al. ............ | 348/297 |
| 7,715,703 | B2 * | 5/2010 | Utagawa et al. .............. | 396/111 |
| 2003/0048373 | A1 * | 3/2003 | Okisu et al. ................... | 348/350 |
| 2004/0090550 | A1 * | 5/2004 | Park .............................. | 348/350 |
| 2004/0169767 | A1 * | 9/2004 | Norita et al. .................. | 348/350 |
| 2007/0154200 | A1 * | 7/2007 | Utagawa et al. .............. | 396/111 |
| 2007/0206937 | A1 * | 9/2007 | Kusaka .......................... | 396/89 |
| 2007/0206940 | A1 * | 9/2007 | Kusaka .......................... | 396/128 |
| 2007/0237511 | A1 * | 10/2007 | Kusaka .......................... | 396/111 |
| 2008/0074534 | A1 * | 3/2008 | Kusaka .......................... | 348/364 |

FOREIGN PATENT DOCUMENTS

JP A-2000-156823 6/2000

* cited by examiner

*Primary Examiner* — Nicholas Giles
(74) *Attorney, Agent, or Firm* — Oliff & Berridge, PLC

(57) ABSTRACT

A solid-state image device has a photoelectric conversion part and has pixels for focus detection and image pixels that are allocated in a row direction and a column direction, and the solid-state image device includes a vertical image scanning circuit that reads image signals to a horizontal image output circuit via vertical image signal lines, a horizontal image scanning circuit that outputs, in a horizontal direction, image signals of one row read to the horizontal image output circuit, a horizontal scanning circuit for focus detection that reads signals for focus detection to a vertical output circuit for focus detection via horizontal signal lines for focus detection, and a vertical scanning circuit for focus detection that outputs, in a vertical direction, signals for focus detection of one column read to the vertical output circuit for focus detection.

3 Claims, 13 Drawing Sheets

SOLID-STATE IMAGE DEVICE HAVING FOCUS DETECTION PIXELS

CROSS-REFERENCE TO RELATED APPLICATION

This application is based upon and claims the benefit of priority from Japanese Patent Application No. 2007-257572, filed on Oct. 1, 2007 and U.S. Provisional Patent Application No. 60/960,498, filed on Oct. 1, 2007, the entire contents of which are incorporated herein by reference.

BACKGROUND

1. Field

The present invention relates to a solid-state image device having pixels for focus detection.

2. Description of the Related Art

In recent years, generally, video cameras and electric cameras using a solid-state image device of CMOS type are widely gaining popularity. In the solid-state image device of CMOS type, a plurality of pixels having photoelectric conversion parts for converting a received light into an electronic signal are allocated in a two dimensional array. Regarding an electric charge accumulated in the photoelectric conversion part of each pixel, the address of each pixel is selected by a vertical scanning circuit, and signals from pixels of one row are read to a horizontal output circuit via vertical signal lines. The signals from pixels of one row read to the horizontal output circuit are output to the outside in sequence column by column by a horizontal scanning circuit.

On the other hand, a general camera system has an auto-focus function to perform focusing of a camera lens automatically, for which a dedicated focus detection device for detecting a focus is used. However, a dedicated focus detection device and an optical system for focus detection to guide a light thereto are required, and this hinders cost reduction and downsizing of cameras.

Accordingly, to make it possible to perform focus detection with the solid-state image device by split-image phase difference method (also called split-image method or phase difference method) without using the dedicated focus detection device, there is proposed a solid-state image device in which pixels for focus detection are embedded in an ordinary solid-state image device (for example, refer to Japanese Unexamined Patent Application Publication No. 2000-156823).

In a conventional solid-state image device in which pixels for focus detection are embedded, signals for focus detection read from the pixels for focus detection are read together with image signals via a circuit which reads normal image signals.

However, when it is desired to read the signals for focus detection quickly, the signals for focus detection cannot be retrieved unless image signals of all the pixels in the solid-state image device are read once. As a result, reading of the signals for focus detection takes time, which causes a problem that a high-speed auto-focus function cannot be realized.

SUMMARY

A proposition of the present invention is to provide a solid-state image device capable of reading signals for focus detection quickly without being affected by a reading time of image signals.

A solid-state image device according to the present invention has a photoelectric conversion part converting an incident light into an electric signal and having pixels for focus detection and image pixels which are allocated in a two dimensional matrix in a row direction and a column direction, the solid-state image device including a image scanning circuit which reads image signals from said image pixels to an image output circuit via image signal lines and outputs the image signal read to said image output circuit, and a scanning circuit for focus detection which reads signals for focus detection from said pixels for focus detection to an output circuit for focus detection via signal lines for focus detection, and outputs the signal for focus detection read to said output circuit for focus detection.

Particularly, the image scanning circuit includes a vertical image scanning circuit which selects a row including the image pixels and reads image signals from the image pixels to a horizontal image output circuit via vertical image signal lines, and a horizontal image scanning circuit which outputs in a horizontal direction image signals of one row read to the horizontal image output circuit, and the scanning circuit for focus detection includes a horizontal scanning circuit for focus detection which selects a column including the pixels for focus detection and reads signals for focus detection from the pixels for focus detection to a vertical output circuit for focus detection via horizontal signal lines for focus detection, and a vertical scanning circuit for focus detection which outputs in a vertical direction signals for focus detection of one column read to the vertical output circuit for focus detection.

Alternatively, a solid-state image device according to the present invention has a photoelectric conversion part converting an incident light into an electric signal and has pixels for focus detection and image pixels which are allocated in a two dimensional matrix in a row direction and a column direction, and the solid-state image device includes a vertical image scanning circuit which selects a row including the image pixels and outputs image signals from the image pixels to a horizontal output circuit via vertical signal lines, a horizontal image scanning circuit which selects a column including the image pixels and outputs image signals in a horizontal direction from the horizontal output circuit, a horizontal scanning circuit for focus detection which selects a column including the pixels for focus detection and outputs signals for focus detection in the horizontal direction from the horizontal output circuit, and a horizontal scanning selection circuit which switches between the horizontal image scanning circuit and the horizontal scanning circuit for focus detection.

Alternatively, a solid-state image device according to the present invention has a photoelectric conversion part converting an incident light into an electric signal and has pixels for focus detection and image pixels which are allocated in a two dimensional matrix in a row direction and a column direction, and the solid-state image device includes a vertical image scanning circuit which selects a row including the image pixels and outputs image signals from the image pixels to a horizontal output circuit via vertical signal lines, a horizontal image scanning circuit which selects a column including the image pixels and outputs image signals in a horizontal direction from the horizontal output circuit, a vertical scanning circuit of column direction for focus detection which selects a row including the pixels for focus detection in a column direction and outputs signals for focus detection from the pixels for focus detection to the horizontal output circuit via the vertical signal lines, a horizontal scanning circuit of column direction for focus detection which selects a column including the pixels for focus detection in the column direction and outputs signals for focus detection from the horizontal output circuit in a horizontal direction, a vertical scanning circuit of row direction for focus detection which selects a row including the pixels for focus detection in a row direction and outputs signals for focus detection from the pixels for focus detection to the horizontal output circuit via the vertical signal lines, a horizontal scanning circuit of row direction for focus detection which selects a column including the pixels for focus detection in the row direction and outputs signals for focus detection from the horizontal output circuit in the horizontal direction, a vertical scanning selection circuit which switches among the vertical scanning circuit of row direction for focus detection, the vertical scanning circuit of column direction for focus detection, and the vertical image scanning circuit, and a horizontal scanning selection circuit which switches among the horizontal scanning circuit of row direction for focus detection, the horizontal scanning circuit of column direction for focus detection, and the horizontal image scanning circuit.

In the solid-state image device according to the present invention, the signal lines, output circuits and scanning circuits for reading image signals from the image pixels, and the signals lines, output circuits and scanning circuits for reading signals for focus detection from the pixels for focus detection are provided separately. Thus, it becomes possible to read signals for focus detection quickly without being affected by a reading time of image signals. Alternatively, scanning circuits for reading image signals and scanning circuits for reading signals for focus detection are provided separately, and the signals for focus detection can be read quickly by switching these circuits.

DETAILED DESCRIPTION OF THE EMBODIMENTS

Figure 9:
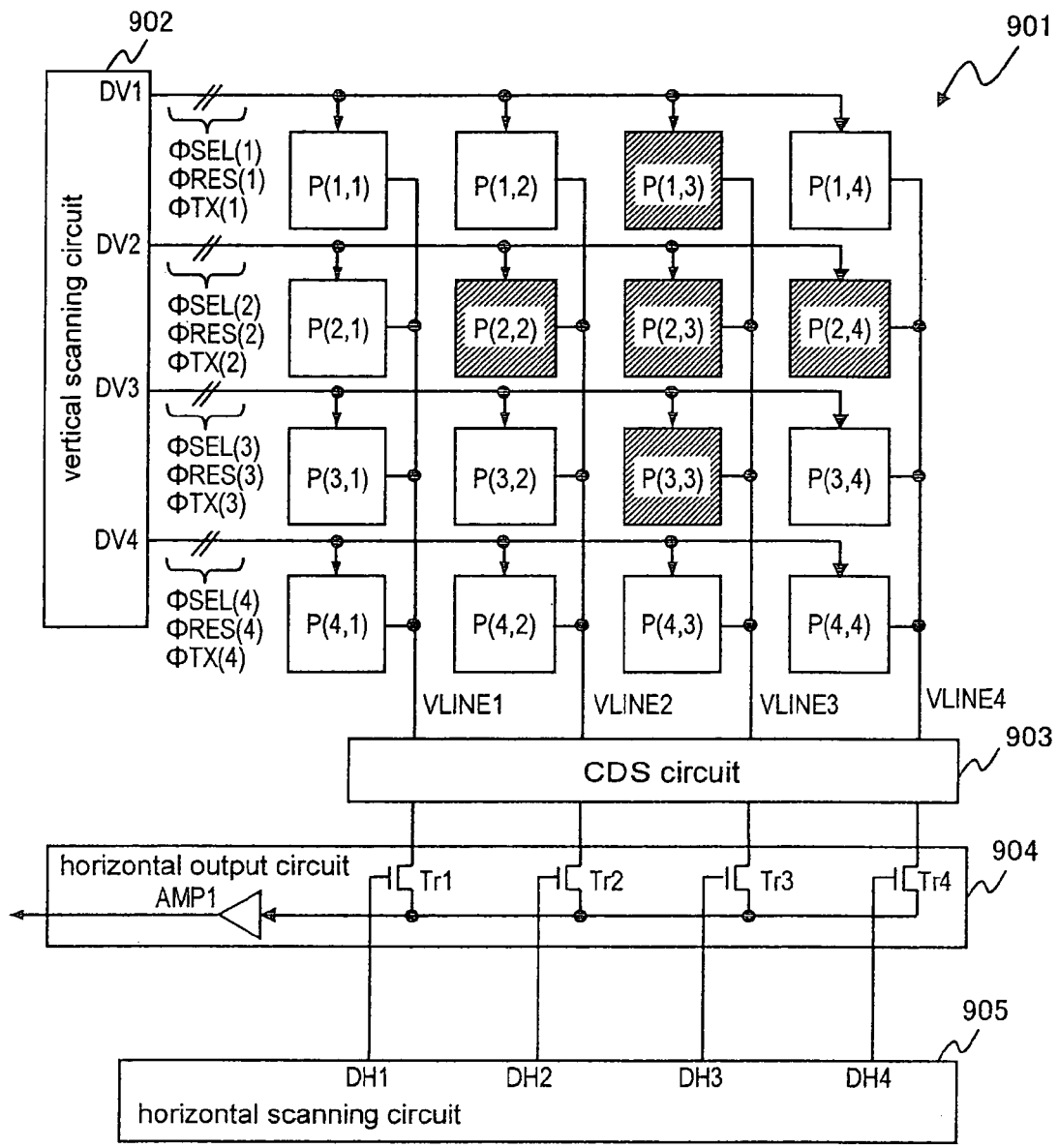
FIG. 9 is a block diagram of a conventional solid-state image device 901.

Hereinafter, embodiments of solid-state image devices according to the present invention will be explained. First, to make the characteristics of this embodiment easily understandable, a general solid-state image device 901 will be explained using FIG. 9. The solid-state image device 901 illustrated in FIG. 9 is drawn with pixels being allocated in a matrix with four rows and four columns for easiness of understanding, but in an actual solid-state image device, multimillion pixels such as 1600×1200 for example are allocated in a matrix.

The solid-state image device 901 has pixels P(1,1) to P(4,4) in four rows and four columns, a vertical scanning circuit 902, a CDS circuit (Correlated Double Sampling circuit) 903, a horizontal output circuit 904, and a horizontal scanning circuit 905.

The vertical scanning circuit 902 gives timing signals φSEL(n), φRES(n), and φTX(n) for reading each row of the pixels P(1,1) to P(4,4) (n represents one of numbers 1 to 4) to vertical signal lines VLINE1-4. Note that timing signals DVn (DV1 to DV4) for vertical output in FIG. 9 represent the three timing signals φSEL(n), φRES(n), and φTX(n) in a combined manner for each row.

Here, a circuitry of each pixel will be explained using FIG. 10. Although FIG. 10 is a diagram illustrating the circuitry of the pixel P(1,4), note that the other pixels P(1,1) to P(4,4) have the same circuitry.

Figure 10:
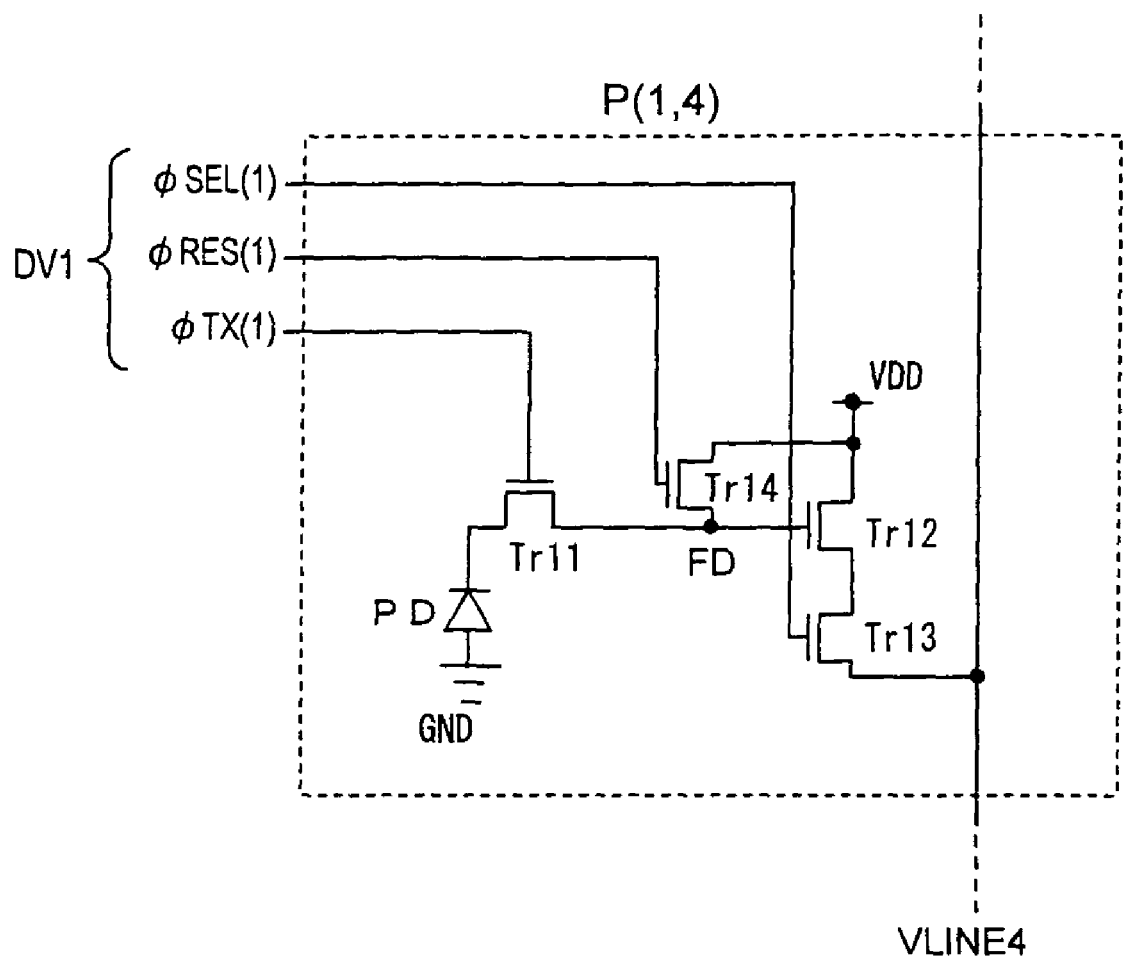
FIG. 10 is a circuit diagram of a pixel.

In FIG. 10, a light incident on a photo-diode PD is photoelectrically transferred and accumulated as an electric charge. The electric charge accumulated in the photo-diode PD is forwarded to an FD part (floating diffusion part) when a timing signal φTX(1) is input to a gate of a forwarding transistor Tr11, and is amplified by an amplifying transistor Tr12. The signal amplified by the amplifying transistor Tr12 is read to the vertical signal line VLINE4 when a timing signal φSEL (1) is input to a gate of a selecting transistor Tr13. Note that when a timing signal φRES(1) is input to a gate of a transistor Tr14 for reset, the FD part is reset to the voltage of a power VDD. Note that GND indicates the ground.

Figure 11:
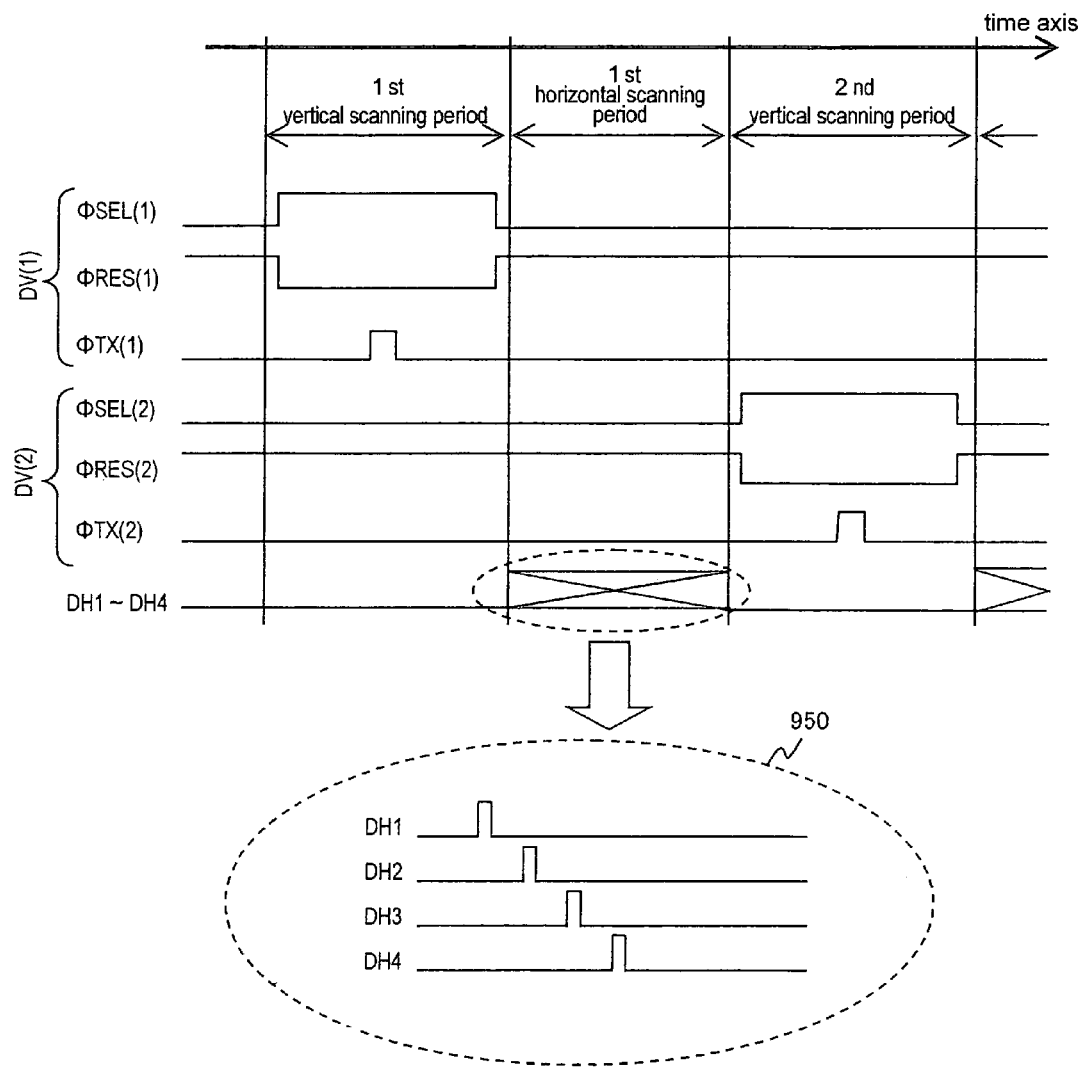
FIG. 11 is a timing chart of the conventional solid-state image device 901.

A timing chart for when reading a signal from the pixel P(1,4) in FIG. 10 is illustrated in FIG. 11. Until a vertical scanning period of the first row is started, the timing signal φRES(1) is at a high-level, and the transistor Tr14 for reset is in an ON state (reset state). Once the vertical scanning period of the first row is started, the timing signal φRES(1) turns to a low-level, the timing signal φSEL(1) turns to a high-level, the selecting transistor Tr13 thereby turns to an ON state, and the signal of the FD part amplified by the amplifying transistor Tr12 is read to the vertical signal line VLINE4. In this state, the timing signal φTX(1) turns to a high-level for a short period of time, the forwarding transistor Tr11 turns on, and the electric charge accumulated in the photo-diode PD is forwarded to the FD part. Similarly, signals output from the pixels P(1,1) to P(4,4) are read row by row to the respective corresponding vertical signal lines VLINE1 to VLINE4, and thereafter input to the CDS circuit 903 allocated for each of the columns.

Here, the CDS circuit 903 will be explained briefly. The CDS circuit 903 is a circuit which reads an optical signal (exposed signal) and a dark signal (unexposed signal) from each of the pixels P(1,1) to P(4,4) and subtracts the dark signal from the optical signal for making dispersion between the pixels to be small, and accumulates signals of each column temporarily in capacitors therein. Note that the dark signal is a signal to be read to the vertical signal lines VLINE1 to VLINE4 from each pixel when the FD part is reset. Further, the optical signal is a signal to be read to the vertical signal lines VLINE1 to VLINE4 from each pixel after the electric charge accumulated in the photo-diode PD is forwarded to the FD part.

In FIG. 11, when the vertical scanning period of the first row finishes, the signals of each column read to the CDS circuit 903 are output to the outside column by column. For example, the portion shown by a dashed line circle 950 illustrates timings of timing signals DH1 to DH4 for horizontal output, which are output from the horizontal scanning circuit 905. When a horizontal scanning period of the first row is started, first the timing signal DH1 for horizontal output turns to a high-level, a transistor Tr1 of the horizontal output circuit 904 in FIG. 9 turns to an ON state and inputs the signals read from the vertical signal line VLINE1 which are accumulated in the CDS circuit 903 to an output amplifier AMP1, and the output amplifier AMP1 amplifies the signals to a predetermined voltage and outputs them to the outside of the solid-state image device 901. Next, the timing signal DH2 for horizontal output turns to a high-level, a transistor Tr2 of the horizontal output circuit 904 in FIG. 9 turns to an ON state and inputs the signals read from the vertical signal line VLINE2 which are accumulated in the CDS circuit 903 to the output amplifier AMP1, and the output amplifier AMP1 amplifies the signals to a predetermined voltage and outputs them to the outside of the solid-state image device 901. Similarly, the timing signal DH3 for horizontal output turns to a high-level, a transistor Tr3 of the horizontal output circuit 904 in FIG. 9 turns to an ON state and inputs the signals read from the vertical signal line VLINE3 which are accumulated in the CDS circuit 903 to the output amplifier AMP1, and the output amplifier AMP1 amplifies the signals to a predetermined voltage and outputs them to the outside of the solid-state image device 901. Finally, the timing signal DH4 for horizontal output turns to a high-level, a transistor Tr4 of the horizontal output circuit 904 in FIG. 9 turns to an ON state and inputs the signals read from the vertical signal line VLINE4 which are accumulated in the CDS circuit 903 to the output amplifier AMP1, and the output amplifier AMP1 amplifies the signals to a predetermined voltage and outputs them to the outside of the solid-state image device 901.

Thus, in the horizontal scanning period of the first row, signals of the respective columns read to the CDS circuit 903 are read in sequence in the vertical scanning period of the first row, and are output to the outside of the solid-state image device 901.

Figure 12:
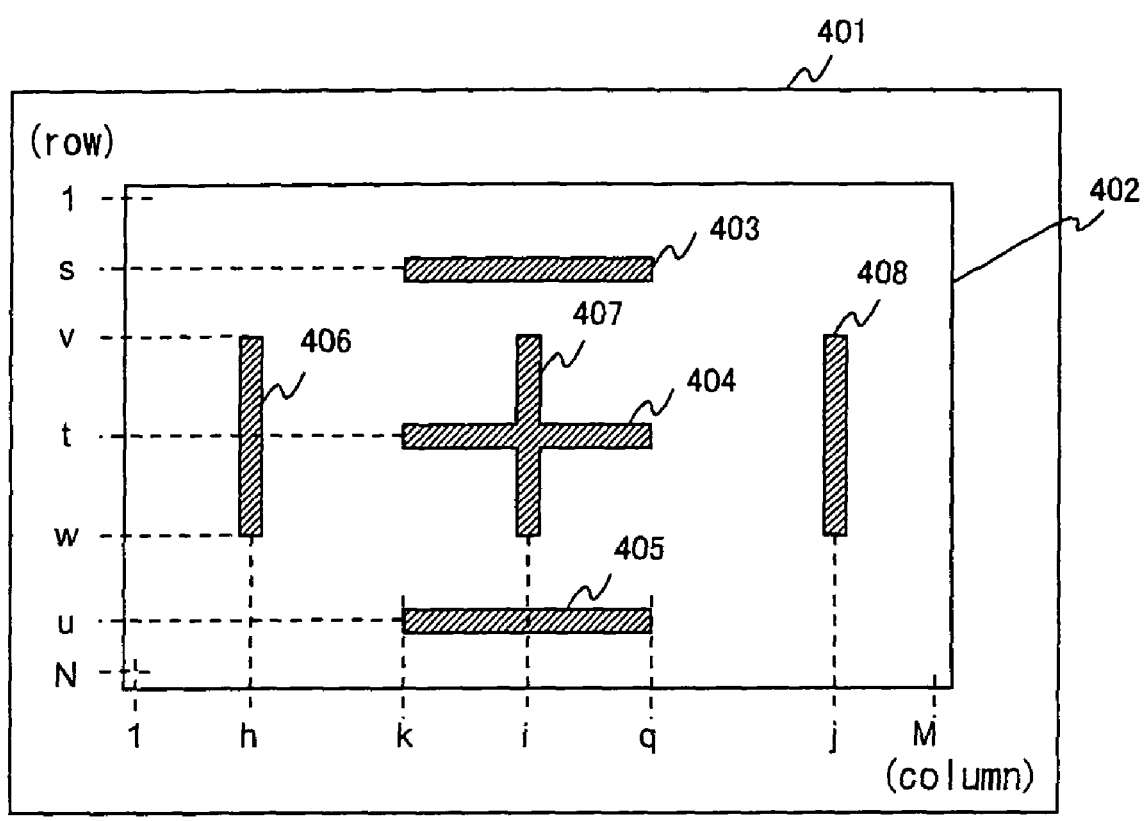
FIG. 12 is an explanatory diagram illustrating an allocation of AF (auto focus) areas.

Here, in FIG. 9, the pixels P(1,3), P(2,2) to P(2,4), and P(3,3) shown by hatching indicate pixels for focus detections. The other pixels not shown by hatching indicate image pixels. Here, an allocation of the pixels for focus detection and the image pixels will be explained using FIG. 12. FIG. 12 is a diagram illustrating an example of AF (auto focus) areas having a plurality of pixels for focus detection allocated in a solid-state image device 401. In FIG. 12, in an effective pixels area 402 of the solid-state image device 401, pixels including image pixels and pixels for focus detection are allocated in a matrix with N rows and M columns. Further, in the effective pixels area 402, as AF areas each having a plurality of pixels for focus detection, an AF area 403, an AF area 404, an AF area 405, an AF area 406, an AF area 407, and an AF area 408 are allocated. The AF area 403 in the s-th row, the AF area 404 in the t-th row, and the AF area 405 in the u-th row are AF areas in each of which pixels for focus detection allocated from the k-th column to the q-th column are allocated in a row direction, and are used for obtaining a defocusing amount from image information in a vertical line. The AF area 406 in the h-th column, the AF area 407 in the i-th column, and the AF area 408 in the j-th column are AF areas in each of which pixels for focus detection allocated from the v-th row to the w-th row are allocated in the column direction, and are used for obtaining a defocusing amount from image information in a horizontal line.

Figure 13A:
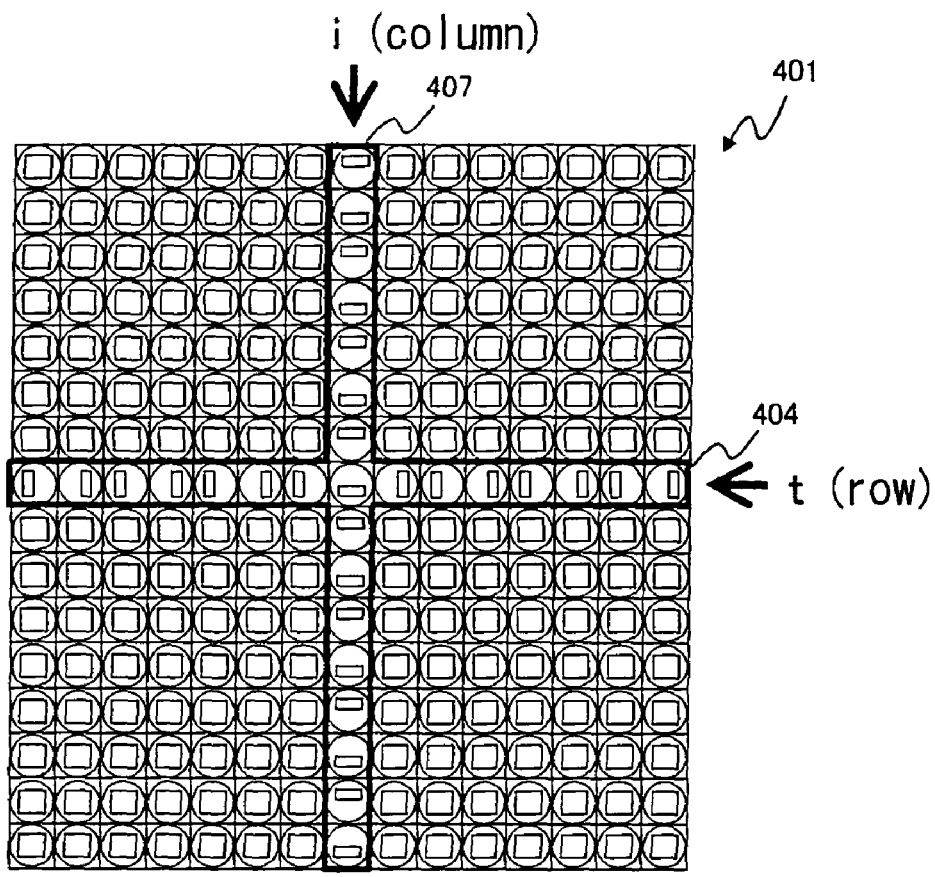
FIG. 13 are explanatory diagrams illustrating a structure of pixels for focus detection.

Here, pixels for focus detection of split-image method will be explained using FIG. 13. FIG. 13(a) is a diagram extracting a central part (part of the AF area 404 in the t-th row and the AF area 407 in the i-th column) of the solid-state image device 401 in FIG. 12 for illustrating an overview of the pixels.

Figure 13B:
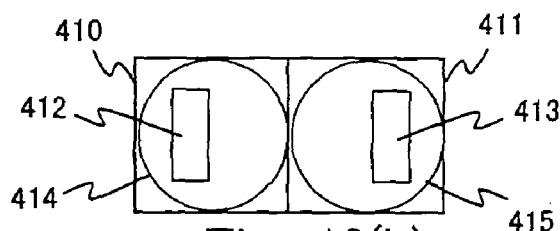
Figure 13C:
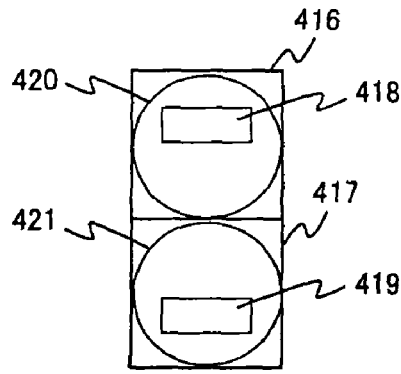

In FIG. 13(a), the pixels for focus detection forming the AF area 404 in the t-th row and the AF area 407 in the i-th column are different from other image pixels in allocation of photoelectric conversion parts. For example, the AF area 404 has the pixels for focus detection corresponding to images split in the row direction, which are allocated as illustrated in FIG. 13(b). In FIG. 13(b), pixels 410, 411 for focus detection are pixels split to be a pair. In the pixel 410 for focus detection on a left side of splitting, a photoelectric conversion part 412 is allocated in a left half portion, and in the pixel 411 for focus detection on a right side of splitting, a photoelectric conversion part 413 is allocated in a right half portion. Further, the AF area 407 has the pixels for focus detection corresponding to images split in the column direction, which are allocated as illustrated in FIG. 13(c). In FIG. 13(c), pixels 416, 417 for focus detection are pixels split to be a pair. In the pixel 416 for focus detection on an upper side of splitting, a photoelectric conversion part 418 is allocated in an upper half portion, and in the pixel 417 for focus detection on a lower side of splitting, a photoelectric conversion part 419 is allocated in a lower half portion.

For example, in FIG. 9, the pixels P(1,3), P(2,3), and P(3,3) shown by hatching are the pixels for focus detection corresponding to images split in the column direction similarly to the AF 407 in FIG. 13, and the pixels P(2,2) and P(2,4) shown by hatching are the pixels for focus detection corresponding to images split in the row direction similarly to the AF area 404 in FIG. 13. Note that the pixel P(2,3) may be the pixels for focus detection corresponding to images split in the row direction. However, in this case, it will have a structure of either the pixel 410 for focus detection or the pixel 411 for focus detection in FIG. 13(b).

Thus, in the solid-state image device in which the pixels for focus detection of the split-image phase difference method are embedded, the circuits for reading image signals from normal image pixels are used also for the signals for focus detection from the pixels for focus detection as explained with FIG. 9, and it is arranged that the signals for focus detection are read together with image signals. Therefore, when focus detection is performed in the solid-state image device 401 in which the plurality of AF areas are allocated in the effective pixels area 402 as illustrated in FIG. 12, it is necessary that signals from the image pixels and the pixels for focus detection of one screen are read once, and then signals for focus detection from the pixels for focus detection forming each AF area are extracted.

A solid-state image device according to each embodiment which will be explained below is capable of reading signals for focus detection without being affected by reading of image signals.

First Embodiment

Figure 1:
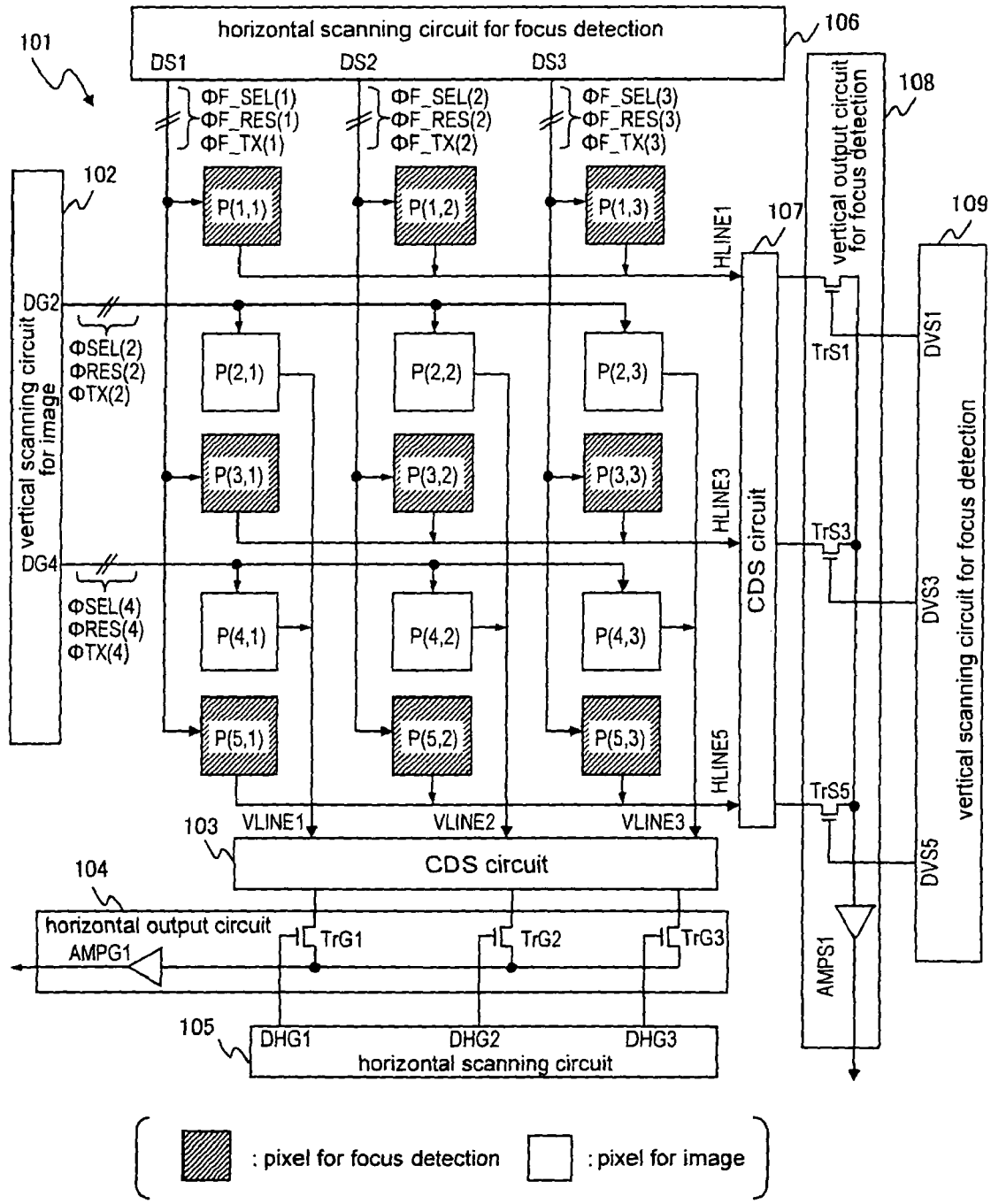
FIG. 1 is a block diagram of a solid-state image device 101 according to a first embodiment.

FIG. 1 illustrates a solid-state image device 101 according to a first embodiment. Note that the circuitry of the pixels explained previously using FIG. 10 and the timings of the timing signals φSEL(n), φRES(n), and φTX(n) explained previously using FIG. 11 for reading signals from respective pixels are also the same in the solid-state image device 101 according to this embodiment.

The solid-state image device 101 has pixels P(1,1) to P(5,3) in five rows and three columns, a vertical image scanning circuit 102, a CDS circuit 103, a horizontal image output circuit 104, a horizontal image scanning circuit 105, a horizontal scanning circuit 106 for focus detection, a CDS circuit 107, a vertical output circuit 108 for focus detection, and a vertical scanning circuit 109 for focus detection.

First, circuits for reading image signals from image pixels will be explained.

The vertical image scanning circuit 102 gives timing signals φSEL(2), φRES(2), and φTX(2) and timing signals φSEL(4), φRES(4), and φTX(4) for reading signals to vertical signal lines VLINE1-3 from the pixels P(2,1) to P(2,3) in the second row and the pixels P(4,1) to P(4,3) in the fourth row, in which there are image pixels. Note that a timing signal DG2 for vertical output in FIG. 1 represents three timing signals φSEL(2), φRES(2), and φTX(2) in a combined manner for each row, and a timing signal DG4 represents three timing signals φSEL(4), φRES(4), and φTX(4) in a combined manner for each row.

Signals output from the pixels P(2,1) to P(2,3) and the pixels P(4,1) to P(4,3) by the timing signals DG2 and DG4 for vertical output are read to the vertical signal lines VLINE1 to VLINE3 corresponding to the respective columns, and thereafter input to the CDS circuit 103 allocated for each of the columns.

The CDS circuit 103 is a correlated double sampling circuit operating similarly to the CDS circuit 903 explained previously, in which only the number of columns of signals to be input/output is changed from four to three. The CDS circuit 103 temporarily accumulates signals read to the vertical signal lines VLINE1 to VLINE3 in capacitors therein column by column.

The horizontal image output circuit 104 operates similarly to the horizontal output circuit 904 explained previously, in which only the number of columns of signals to be input is changed from four to three. The horizontal image output circuit 104 inputs signals of one row read from the vertical signal lines VLINE1 to VLINE3, which are accumulated temporarily in the CDS circuit, to an output amplifier AMPG1 in sequence according to timing signals DHG1 to DHG3 for horizontal output from the horizontal image scanning circuit 105, and the output amplifier AMPG1 amplifies the signals to a predetermined voltage and outputs the image signals to the outside of the solid-state image device 101. Note that transistor TrG1 to TrG3 of the horizontal image output circuit 104 correspond to the transistor Tr1 to Tr3 of the horizontal output circuit 904.

The horizontal image scanning circuit 105 operates similarly to the horizontal scanning circuit 905 explained previously, in which only the number of columns of signals to be output is changed from four to three, and gives timings for the horizontal image output circuit 104 to input the signals accumulated temporarily in the CDS circuit 103 to the output amplifier AMP1. Note that the timing signals DHG1 to DHG3 for horizontal output of the horizontal image scanning circuit 105 correspond to the timing signals DH1 to DH3 for horizontal output of the horizontal scanning circuit 905.

Next, circuits for reading signals for focus detection from pixels for focus detection will be explained.

The horizontal scanning circuit 106 for focus detection gives timings for reading signals to horizontal signal lines HLINE1-3 from the pixels P(1,1) to P(1,3) in the first row, the pixels P(3,1) to P(3,3) in the third row, and pixels P(5,1) to P(5,3) in the fifth row, in which there are pixels for focus detection. There are given timing signals φF_SEL(1), φF_RES(1), and φF_TX(1) for the first column, timing signals φF_SEL(2), φF_RES(2), and φF_TX(2) for the second column, and timing signals φF_SEL(3), φF_RES(3), and φF_TX(3) for the third column.

Note that a timing signal DS1 for horizontal output represents the three timing signals φF_SEL(1), φF_RES(1), and φF_TX(1) in a combined manner for each row. Similarly, a timing signal DS2 for horizontal output represents the three timing signals φF_SEL(2), φF_RES(2), and φF_TX(2) in a combined manner for each row, and a timing signal DS3 for horizontal output represents the three timing signals φF_SEL(3), φF_RES(3), and φF_TX(3) in a combined manner for each row.

Here, the pixel P(1,3) for focus detection has a different allocation of image pixel photoelectric conversion parts as explained with FIG. 13, but has the same circuitry as in FIG. 10. Note that regarding the pixels for focus detection, it is only needed to consider by replacing the three timing signals φSEL(1), φRES(1), and φTX(1) forming the timing signal DV1 for vertical output in FIG. 10 with the three timing signals φF_SEL(n), φF_RES(n), and φF_TX(n) forming the timing signal DS1 for horizontal output.

Signals output from the pixels P(1,1), P(3,1), and P(5,1) in the first column by the timing signals DS1 to DS3 for horizontal output given from the horizontal scanning circuit 106 for focus detection are read to the horizontal signal lines HLINE1, HLINE3, and HLINE5 corresponding to the respective rows, and thereafter input to the CDS circuit 107 allocated for each of the rows.

The CDS circuit 107 is a correlated double sampling circuit operating similarly to the CDS circuit 903 and the CDS circuit 103, which are explained previously. The CDS circuit 107 temporarily accumulates signals read to the horizontal signal lines HLINE1, HLINE3, and HLINE5 row by row in capacitors therein.

The vertical output circuit 108 for focus detection, which is different from the horizontal image output circuit 104 only in whether it is in the column direction or in the row direction, inputs signals to an output amplifier AMPS1 in sequence according to timings of timing signals DVS1, DVS3, and DVS5 for vertical output given from the vertical scanning circuit 109 for focus detection, and the output amplifier AMPS1 amplifies the signals for focus detection to a predetermined voltage and outputs them to the outside of the solid-state image device 101.

Figure 2:
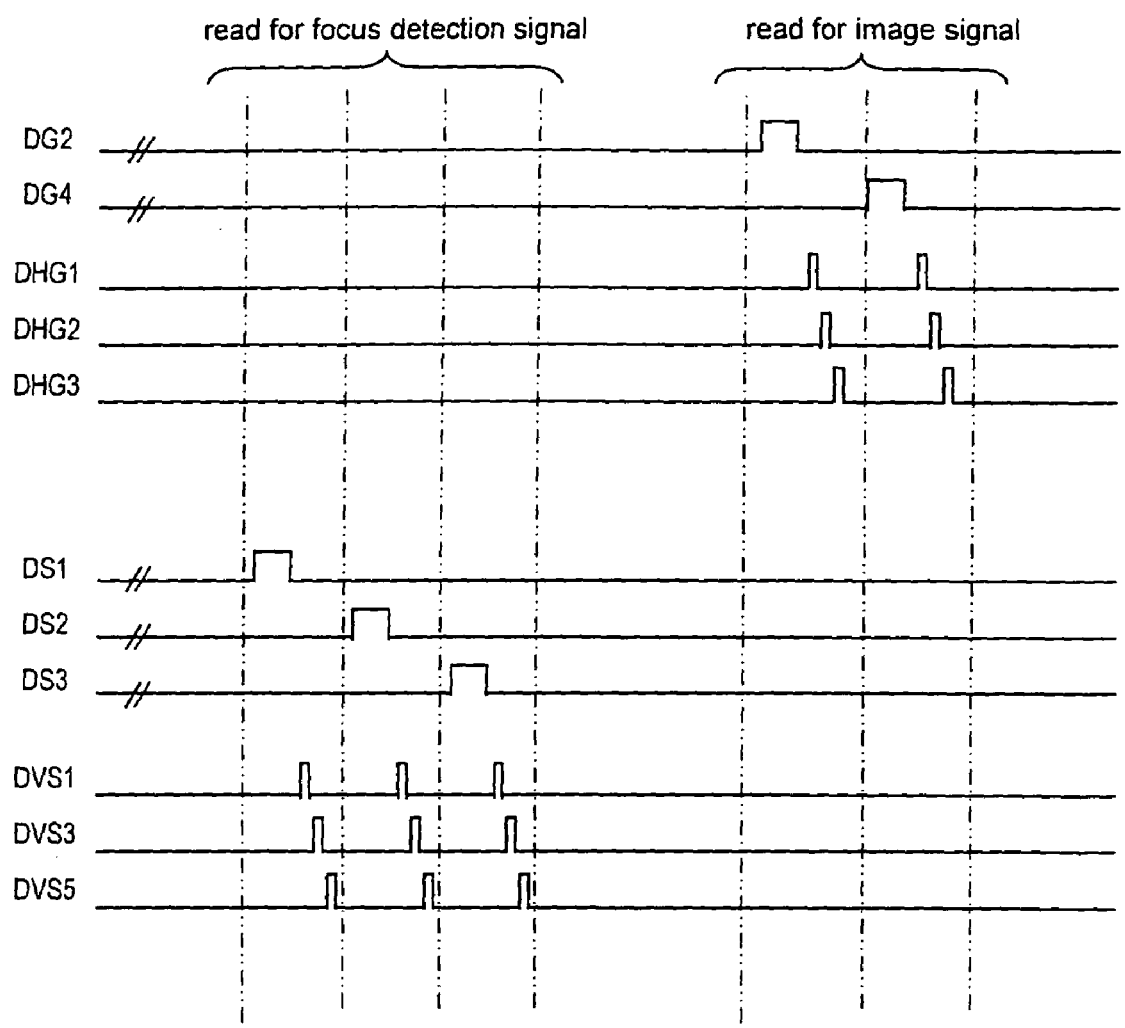
FIG. 2 is a timing chart of the solid-state image device 101 according to the first embodiment.

Next, a timing chart for the solid-state image device 101 will be explained using FIG. 2. FIG. 2 illustrates timings for reading signals for focus detection from the pixels for focus detection and timings for reading image signals from the image pixels.

To begin with, timings for reading signals for focus detection from pixels P(1,1), P(3,1), P(5,1), P(1,2), P(3,2), P(5,2), P(1,3), P(3,3), and P(5,3) for focus detection in FIG. 1 will be explained. First, when the timing signal DS1 for horizontal output is given to the pixels P(1,1), P(3,1), and P(5,1) for focus detection in the first column from the horizontal scanning circuit 106 for focus detection, signals for focus detection are read from these pixels to the horizontal signal lines HLINE1, HLINE3, and HLINE5, and the signals for focus detection of one column are accumulated temporarily in internal capacitors of the CDS circuit 107.

Next, when the timing signal DS1 for horizontal output turns off, the timing signal DVS1 for vertical output is given from the vertical scanning circuit 109 for focus detection to a gate of a transistor TrS1 of the vertical output circuit 108 for focus detection, and the signal read to the horizontal signal line HLINE1 which is accumulated temporarily in the internal capacitor of the CDS circuit 107 is input to the output amplifier AMPS1 and is output to the outside.

Next, when the timing signal DVS1 for vertical output turns off, the timing signal DVS3 for vertical output is given from the vertical scanning circuit 109 for focus detection to a gate of a transistor TrS3 of the vertical output circuit 108 for focus detection, and the signal read to the horizontal signal line HLINE3 which is accumulated temporarily in the internal capacitor of the CDS circuit 107 is input to the output amplifier AMPS1 and is output to the outside.

Next, when the timing signal DVS3 for vertical output turns off, the timing signal DVS5 for vertical output is given from the vertical scanning circuit 109 for focus detection to a gate of a transistor TrS5 of the vertical output circuit 108 for focus detection, and the signal read to the horizontal signal line HLINE5 which is accumulated temporarily in the internal capacitor of the CDS circuit 107 is input to the output amplifier AMPS1 and is output to the outside.

In this manner, the signals of the pixels P(1,1), P(3,1), and P(5,1) for focus detection in the first column are read in sequence.

Next, the timing signal DS2 for horizontal output is given to the pixels P(1,2), P(3,2), and P(5,2) for focus detection in the second column, and signals are accumulated temporarily in the CDS circuit 107 via the horizontal signal line HLINE3. Among the signals for focus detection accumulated temporarily in the CDS circuit 107, similarly to the pixels P(1,1), P(3,1), and P(5,1) for focus detection in the first column, the signals for focus detection read from the pixels P(1,2), P(3,2), and P(5,2) for focus detection are input to the output amplifier AMPS1 and are output to the outside.

Next, the timing signal DS3 for horizontal output is given to the pixels P(1,3), P(3,3), and P(5,3) for focus detection in the third column, and signals are accumulated temporarily in the CDS circuit 107 via the horizontal signal line HLINE5. Among the signals for focus detection accumulated temporarily in the CDS circuit 107, similarly to the pixels P(1,1), P(3,1), and P(5,1) for focus detection in the first column, the signals for focus detection read from the pixels P(1,3), P(3,3), and P(5,3) for focus detection are input to the output amplifier AMPS1 and are output to the outside.

In this manner, the signals for focus detection are read from the pixels P(1,1), P(3,1), P(5,1), P(1,2), P(3,2), P(5,2), P(1,3), P(3,3), and P(5,3) for focus detection in FIG. 1.

Next, timings for reading image signals from the image pixels P(2,1), P(2,2), P(2,3), P(4,1), P(4,2), and P(4,3) in FIG. 1 will be explained. In FIG. 2, first, when the timing signal DG2 for vertical output is given to the image pixels P(2,1), P(2,2), and P(2,3) in the second row from the vertical image scanning circuit 102, image signals are read from these pixels to the vertical signal lines VLINE1 to VLINE3, and the image signals of one row are accumulated temporarily in internal capacitors of the CDS circuit 103.

Next, when the timing signal DG2 for vertical output turns off, the timing signal DHG1 for horizontal output is given from the horizontal image scanning circuit 105 to a gate of the transistor TrG1 of the horizontal image output circuit 104, and the signal read to the vertical signal line VLINE1 which is accumulated temporarily in the internal capacitor of the CDS circuit 103 is input to the output amplifier AMPG1 and is output to the outside.

Next, when the timing signal DHG1 for horizontal output turns off, the timing signal DHG2 for horizontal output is given from the horizontal image scanning circuit 105 to a gate of the transistor TrG2 of the horizontal image output circuit 104, and the signal read to the vertical signal line VLINE2 which is accumulated temporarily in the internal capacitor of the CDS circuit 103 is input to the output amplifier AMPG1 and is output to the outside.

Next, when the timing signal DHG2 for horizontal output turns off, the timing signal DHG3 for horizontal output is given from the horizontal image scanning circuit 105 to a gate of the transistor TrG3 of the horizontal image output circuit 104, and the signal read to the vertical signal line VLINE3 which is accumulated temporarily in the internal capacitor of the CDS circuit 103 is input to the output amplifier AMPG1 and is output to the outside. In this manner, the signals of the image pixels P(2,1), P(2,2), and P(2,3) in the second row are read in sequence.

Next, the timing signal DG4 for vertical output is given to the image pixels P(4,1), P(4,2), and P(4,3) in the fourth row, and signals are accumulated temporarily in the CDS circuit 103 via the vertical signal lines VLINE1 to VLINE3. Among the image signals accumulated temporarily in the CDS circuit 103, similarly to the image pixels P(2,1), P(2,2), and P(2,3) in the second row, the image signals read from the image pixels P(4,1), P(4,2), and P(4,3) are input to the output amplifier AMPG1 and are output to the outside.

In this manner, the image signals are read row by row from the image pixels P(2,1), P(2,2), P(2,3), P(4,1), P(4,2), and P(4,3) in FIG. 1.

As has been explained above about the solid-state image device 101 according to the first embodiment, in the solid-state image device 101 according to the present invention, with respect to the image pixels, there are allocated the vertical image scanning circuit 102 for reading image signals, the vertical signal lines VLINE1-3 for image signals, and the horizontal image output circuit 104 and the horizontal image scanning circuit 105 f for outputting image signals, and with respect to the pixels for focus detection, there are allocated the horizontal scanning circuit 106 for focus detection for reading signals for focus detection, the horizontal signal lines (HLINE1, HLINE3, and HLINE5) for signals for focus detection, the vertical output circuit 108 for focus detection and the vertical scanning circuit 109 for focus detection for outputting signals for focus detection. Therefore, it is possible to read signals for focus detection quickly and independently without being affected by a reading time of image signals.

Note that in this embodiment, an example is explained in which, for easiness of understanding, three pixels for focus detection are embedded in each column, and the image pixels and the pixels for focus detection are allocated separately row by row so that the first row, the third row, and the fifth row are rows of the pixels for focus detection, and the second row and the fourth row are rows of the image pixels. In practice, when embedding a different number of pixels for focus detection in each column as in a solid-state image device 101a illustrated in FIG. 3, the device can be realized similarly to the example in FIG. 1.

Figure 3:
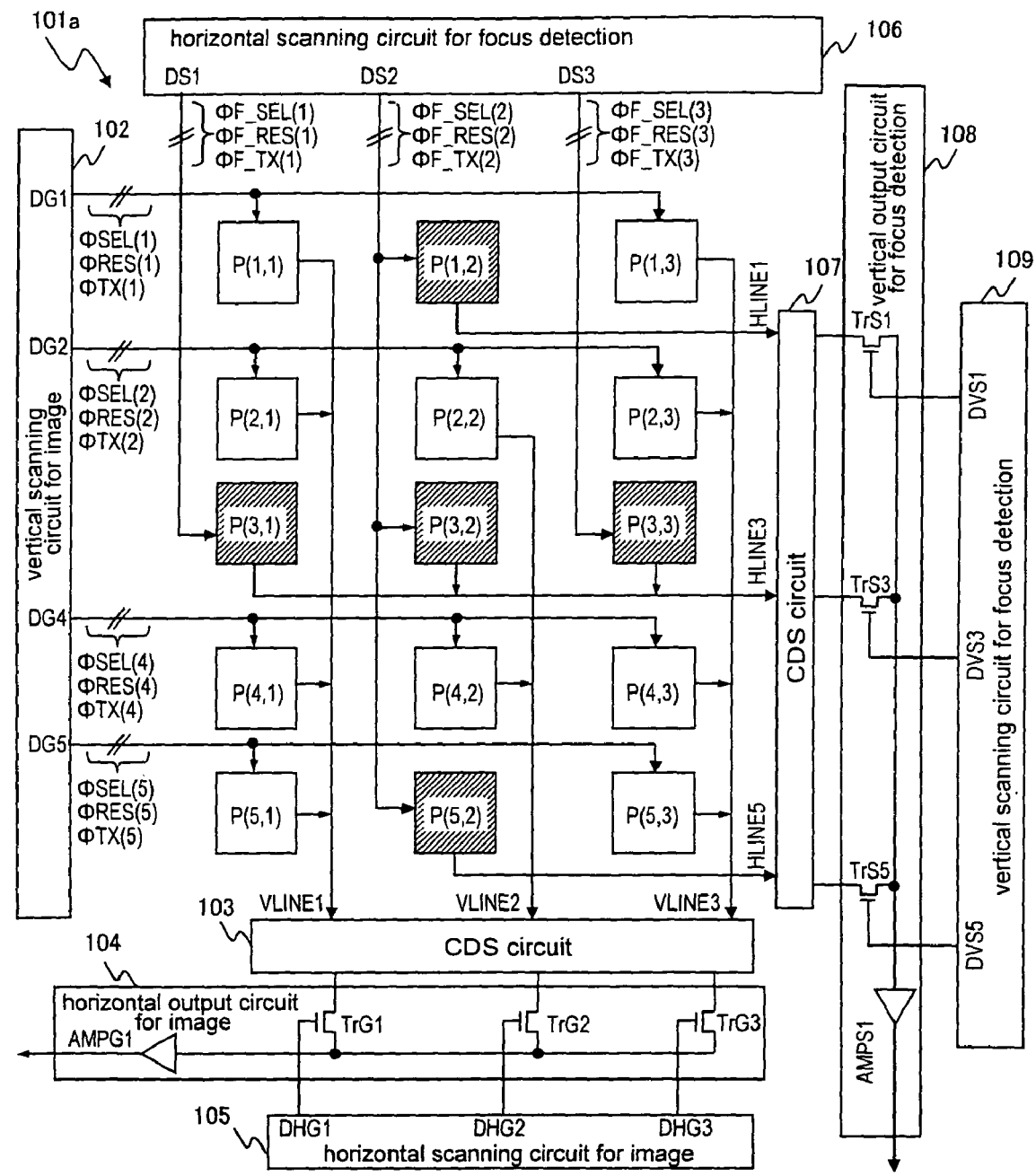
FIG. 3 is a block diagram of a solid-state image device 101a according to the first embodiment.

For example, in FIG. 3, image pixels and a pixel for focus detection are allocated in the first row, in which the image pixels P(1,1) and P(1,3) in the first row are given a timing signal DG1 for vertical output from the vertical image scanning circuit 102, and they are read to the CDS circuit 103 via the vertical signal lines VLINE1 and VLINE3 respectively. With the timing signals DHG1 and DHG3 for horizontal output from the horizontal image scanning circuit 105 being given to the transistors TrG1 and TrG3 of the horizontal image output circuit 104 similarly to the timing chart explained with FIG. 2, image signals of the first row accumulated temporarily in the internal capacitors of the CDS circuit 103 are output to the outside in sequence from the output amplifier AMPG1. In the fifth row, image pixels and a pixel for focus detection are allocated similarly to the first row, but the image pixels (P5,1) and P(5,3) in the fifth row are read to the CDS circuit 103 via the vertical signal lines VLINE1 and VLINE3 respectively by the timing signal DG5 for vertical output from the vertical image scanning circuit 102. These image signals are output to the outside in sequence from the output amplifier AMPG1 of the horizontal image output circuit 104, similarly to the first row.

Further, in FIG. 1, the pixels for focus detection in the first column and the third column are allocated in the first row, the third row and the fifth row, but the pixels for focus detection in the first column and the third column in FIG. 3 are allocated only in the third row. In this case also, similarly to FIG. 1, signals for focus detection can be read from the pixels for focus detection independently from image signals. For example, when reading a signal for focus detection from the pixel P(3,1) for focus detection in the first column, it is read to the CDS circuit 107 via the horizontal signal line HLINE3 by the timing signal DS1 for horizontal output given by the horizontal scanning circuit 106 for focus detection. With the timing signal DVS3 for vertical output from the vertical scanning circuit 109 for focus detection being given to the transistor TrS3 of the vertical output circuit 108 for focus detection similarly to the timing chart explained with FIG. 2, signals for focus detection of the horizontal signal line HLINE3 which are accumulated temporarily in the internal capacitors of the CDS circuit 107 are output to the outside in sequence from the output amplifier AMPS1. In the third column, similarly to the first column, when signals for focus detection are read from the pixel (3,3) for focus detection, they are read to the CDS circuit 107 via the horizontal signal line HLINE 3 by the timing signal DS3 for horizontal output given by the horizontal scanning circuit 106 for focus detection. These image signals are output in sequence to the outside from the output amplifier AMPS1 of the vertical output circuit 108 for focus detection, similarly to the first column.

In this manner, also in the solid-state image device 101a, since the circuits for reading image signals and the circuits for reading signals for focus detection are provided separately, it is possible to read signals for focus detection quickly and independently without being affected by a reading time of image signals.

Figure 4:
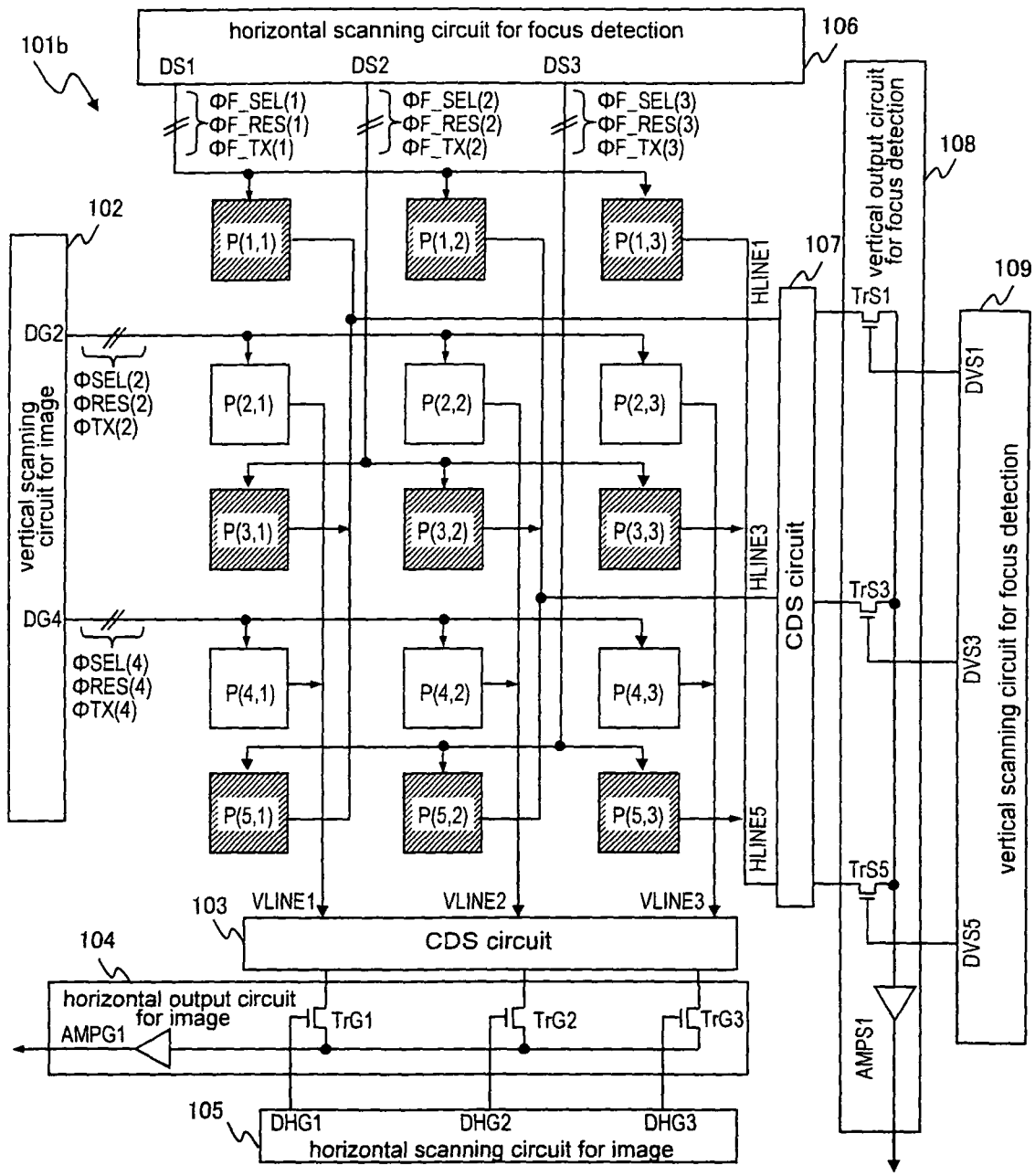
FIG. 4 is a block diagram of a solid-state image device 101b according to the first embodiment.

Note that in the solid-state image device 101 illustrated in FIG. 1 and the solid-state image device 101a illustrated in FIG. 3, since the signals for focus detection allocated in the column direction can be read at once, these devices can be used effectively when the pixels for focus detection in which a split-image direction being the column direction are allocated Modification Example of this Embodiment The solid-state image device 101 explained with FIG. 1 is arranged such that the pixels for focus detection allocated in the same column are read to the CDS circuit 107 column by column, but it is also possible to arrange such that they may be read to the CDS circuit 107 row by row, as in a solid-state image device 101b illustrated in FIG. 4.

For example, in FIG. 4, to the pixels P(1,1), P(1,2), and P(1,3) for focus detection allocated in the first row, the timing signal DS1 for horizontal output is input from the horizontal scanning circuit 106 for focus detection. Similarly, the timing signal DS2 for horizontal output is input to the pixels P(2,1), P(2,2), and P(2,3) for focus detection allocated in the second row, and the timing signal DS3 for horizontal output is input from the horizontal scanning circuit 106 for focus detection from the pixels P(3,1), P(3,2), and P(3,3) for focus detection allocated in the third row.

When the timing signal DS1 for horizontal output is output, the signal for focus detection read from the pixel P(1,1) for focus detection is read to the horizontal signal line HLINE1, the signal for focus detection read from the pixel P(1,2) for focus detection is read to the horizontal signal line HLINE2, and the signal for focus detection read from the pixel P(1,3) for focus detection is read to the horizontal signal line HLINE3. They are accumulated temporarily in the internal capacitors of the CDS circuit 107. The operation of outputting the signals for focus detection read from the pixels P(1,1), P(1,2), and P(1,3) for focus detection in the first row accumulated temporarily in the internal capacitors of the CDS circuit 107 to the outside in sequence from the vertical output circuit 108 for focus detection is the same as that explained with FIG. 1 and FIG. 2, and hence repeated explanation is omitted.

Similarly, when the timing signal DS2 for horizontal output is output, the signal for focus detection read from the pixel P(3,1) for focus detection is read to the horizontal signal line HLINE1, the signal for focus detection read from the pixel P(3,2) for focus detection is read to the horizontal signal line HLINE2, and the signal for focus detection read from the pixel P(3,3) for focus detection is read to the horizontal signal line HLINE3. They are accumulated temporarily in the internal capacitors of the CDS circuit 107, and output to the outside in sequence from the vertical output circuit 108 for focus detection similarly to the first row. Furthermore, when the timing signal DS3 for horizontal output is output, the signal for focus detection read from the pixel P(5,1) for focus detection is read to the horizontal signal line HLINE1, the signal for focus detection read from the pixel P(5,2) for focus detection is read to the horizontal signal line HLINE2, and the signal for focus detection read from the pixel P(5,3) for focus detection is read to the horizontal signal line HLINE3. They are accumulated temporarily in the internal capacitors of the CDS circuit 107, and output to the outside in sequence from the vertical output circuit 108 for focus detection similarly to the first row.

Note that in FIG. 4, reading of image pixels is the same as in FIG. 1, and thus repeated explanation is omitted.

In this manner, since the signals for focus detection allocated in the row direction can be read at once, the device can be used effectively when the pixels for focus detection in which the split-image direction is the row direction are allocated. Note that also in the solid-state image device 101b of this modification example, with respect to the image pixels, there are allocated the vertical image scanning circuit 102 for reading image signals, the vertical signal lines VLINE1-3 for image signals, and the horizontal image output circuit 104 and the horizontal image scanning circuit 105 for outputting image signals, and with respect to the pixels for focus detection, there are allocated the horizontal scanning circuit 106 for focus detection for reading signals for focus detection, the horizontal signal lines (HLINE1, HLINE3, and HLINE5) for signals for focus detection, the vertical output circuit 108 for focus detection and the vertical scanning circuit 109 for focus detection for outputting signals for focus detection. Therefore, it is possible to read signals for focus detection quickly and independently without being affected by a reading time of image signals.

Further, it may also be a solid-state image device in which the solid-state image device 101 illustrated in FIG. 1 and the solid-state image device 101b illustrated in FIG. 4 are combined, and pixels for focus detection in which the split-image direction is in the column direction and pixels for focus detection in which the split-image direction is in the row direction exist in a mixed manner. In this case, there may be provided two systems of circuits for the row direction and the column direction, each having the horizontal scanning circuit 106 for focus detection in FIG. 1 and FIG. 4, the horizontal signal lines (HLINE1, HLINE3, and HLINE5), the vertical output circuit 108 for focus detection, and the vertical scanning circuit 109 for focus detection. With such a structure, three types of signals of the image pixels, the pixels for focus detection in which the split image direction is in the column direction, and the pixels for focus detection in which the split-image direction is in the row direction can be read independently at the same time. Therefore, it is possible not only to read signals for focus detection quickly and independently without being affected by a reading time of image signals, but also to increase the speed of the operation for focus detection further.

As has been explained above, the first embodiment has a structure such that, in the solid-state image device having the image pixels and the pixels for focus detection allocated in a two dimensional matrix with a row direction and a column direction, the circuits for reading and outputting from the image pixels and the circuits for reading and outputting from the pixels for focus detection are provided separately. That is, the image signals read from the image pixels are read by the image scanning circuits to the image output circuit via the image signal lines and output to the outside. Simultaneously, the signals for focus detection read from the pixels for focus detection are read by the scanning circuits for focus detection to the output circuit for focus detection via the signal lines for focus detection and output to the outside. In this manner, the signals for focus detection can be read independently irrespective of the reading operation of image signals, and the operation for focus detection can be performed at a high speed.

Second Embodiment

Next, a solid-state image device 201 according to a second embodiment will be explained using FIG. 5. The solid-state image device 201 has pixels P(1,1) to P(4,4) in four rows and four columns, a vertical scanning circuit 902, a CDS circuit 903, a horizontal output circuit 904, a horizontal image scanning circuit 205, a horizontal scanning circuit 206 for focus detection, switches SWHG1 to SWHG4, and switches SWHS2 to SWHS4.

Here, the vertical scanning circuit 902, the CDS circuit 903, and the horizontal output circuit 904 having the same numerals as in FIG. 9 are identical to those in FIG. 9. The operation up to accumulating of signals read from respective pixels via the vertical signal lines VLINE1 to VLINE4 temporarily in the internal capacitors of the CDS circuit 903 is exactly the same as in FIG. 9. What is different from FIG. 9 is the timing of reading the signals accumulated temporarily in the internal capacitors of the CDS circuit 903 from the horizontal output circuit 904.

To gates of the transistors Tr1 to Tr4 of the horizontal output circuit 904, the horizontal image scanning circuit 205 is coupled via the switch SWHG1, the switch SWHG2, the switch SWHG3, and the switch SWHG4, respectively. Further, to the gates of the transistors Tr2 to Tr4 corresponding to the columns in which the pixels P(1,3), P(2,2), P(2,3), P(2,4), P(3,3) for focus detection shown by hatching are allocated, the horizontal scanning circuit 206 for focus detection is coupled via the switch SWHS2, the switch SWHS3, and the switch SWHS4, respectively.

Figure 6:
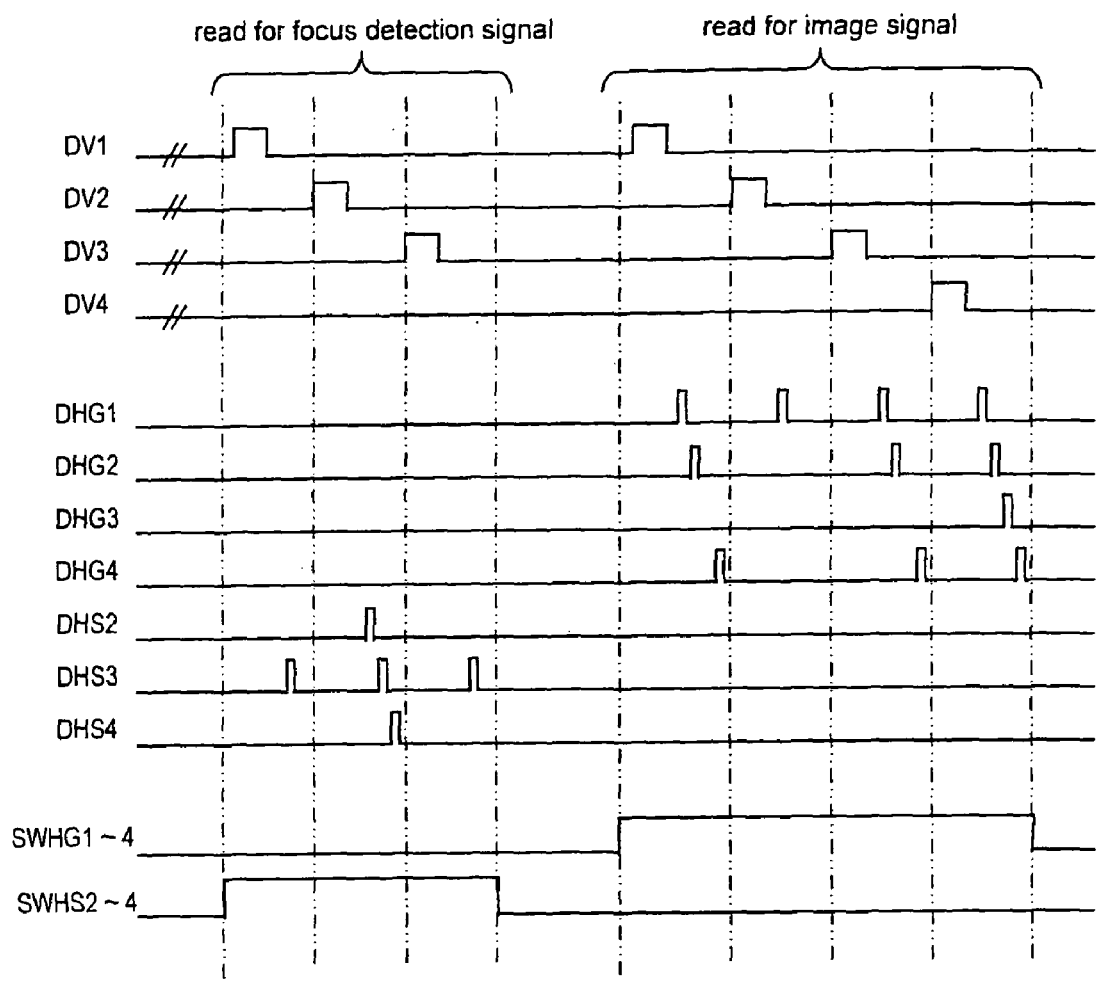
FIG. 6 is a timing chart of the solid-state image device 201 according to the second embodiment.

Hereinafter, timings for reading signals for focus detection and timings for reading image signals in the solid-state image device 201 according to this embodiment will be explained in order using FIG. 6.

[When Reading Signals for Focus Detection from Pixels for Focus Detection]

Figure 5:
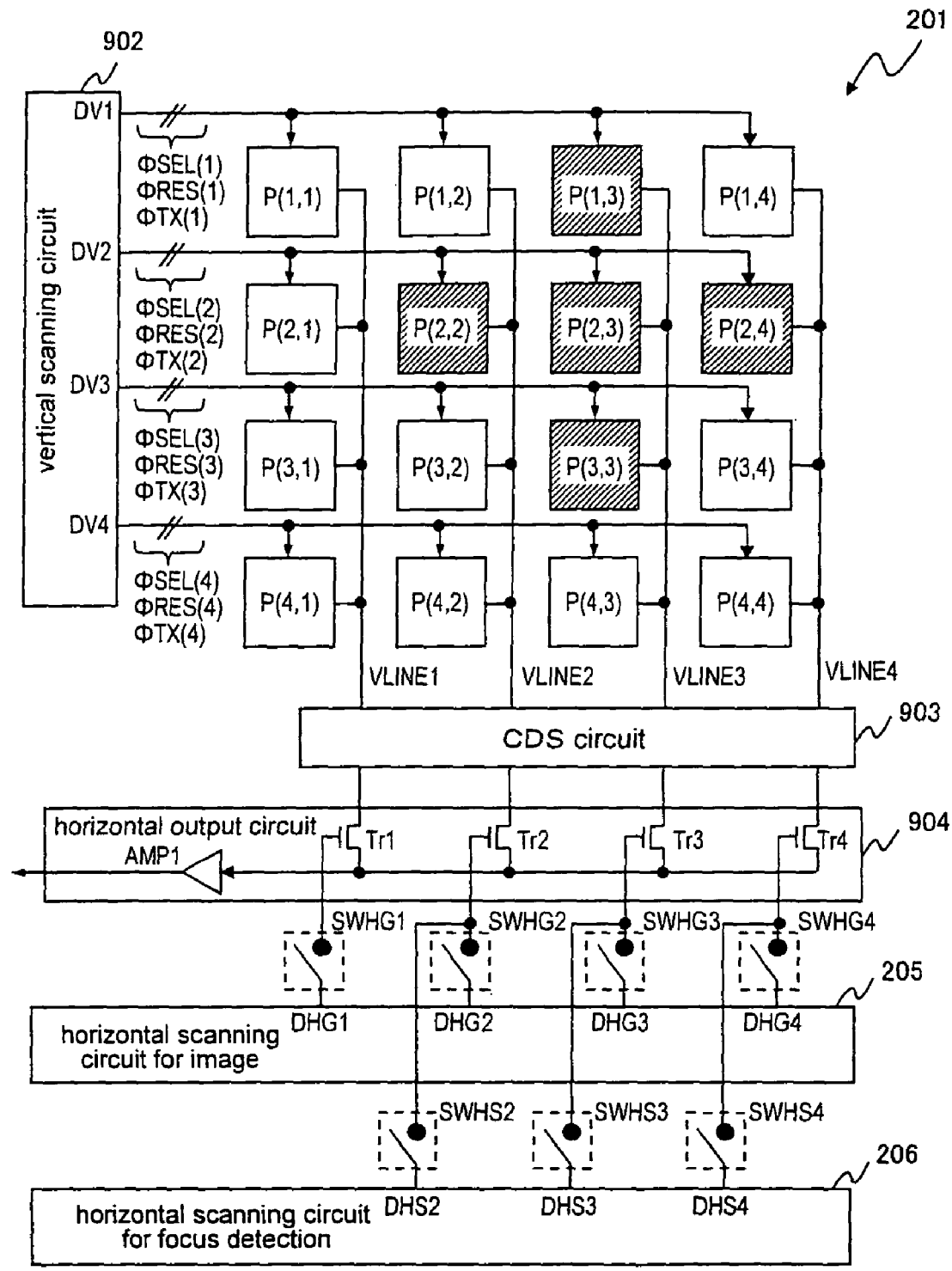
FIG. 5 is a block diagram of a solid-state image device 201 according to a second embodiment.

In FIG. 5, the pixels for focus detection are pixels P(1,3), P(2,2), P(2,3), P(2,4), and P(3,3). Further, in FIG. 6, during a period of reading signals for focus detection, the switches SWHS2 to SWHS4 turn to ON states (closed states), and the switches SWHG1 to SWHG4 are in OFF states (open states).

In this state, first, when the timing signal DV1 for vertical output is given from the vertical scanning circuit 902 to the pixels P(1,1), P(1,2), P(1,3), and P(1,4) in the first row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DV1 for vertical output turns off, a timing signal DHS3 for horizontal output is given from the horizontal scanning circuit 206 for focus detection to the gate of the transistor Tr3 of the horizontal output circuit 904 via the switch SWHS3, and the signal read to the vertical signal line VLINE3 which is accumulated temporarily in the internal capacitor of the CDS circuit 903 is input to the output amplifier AMP1, amplified to a predetermined voltage and output to the outside. That is, the signal for focus detection read from the pixel P(1,3) for focus detection is output to the outside from the horizontal output circuit 904.

Next, when the timing signal DV2 for vertical output is given from the vertical scanning circuit 902 to the pixels P(2,1), P(2,2), P(2,3), and P(2,4) in the second row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DV2 for vertical output turns off, a timing signal DHS2 for horizontal output is given from the horizontal scanning circuit 206 for focus detection to the gate of the transistor Tr2 of the horizontal output circuit 904 via the switch SWHS2, and the signal read to the vertical signal line VLINE2 which is accumulated temporarily in the internal capacitor of the CDS circuit 903 is input to the output amplifier AMP1, amplified to a predetermined voltage and output to the outside. That is, the signal for focus detection read from the pixel P(2,2) for focus detection is output to the outside from the horizontal output circuit 904.

Further, when the timing signal DHS2 for horizontal output turns off, the timing signal DHS3 for horizontal output is given from the horizontal scanning circuit 206 for focus detection to the gate of the transistor Tr3 of the horizontal output circuit 904 via the switch SWHS3, and the signal read to the vertical signal line VLINE3 which is accumulated temporarily in the internal capacitor of the CDS circuit 903 is input to the output amplifier AMP1, amplified to a predetermined voltage and output to the outside. That is, the signal for focus detection read from the pixel P(2,3) for focus detection is output to the outside from the horizontal output circuit 904.

Furthermore, when the timing signal DHS3 for horizontal output turns off, a timing signal DHS4 for horizontal output is given from the horizontal scanning circuit 206 for focus detection to the gate of the transistor Tr4 of the horizontal output circuit 904 via the switch SWHS4, and the signal read to the vertical signal line VLINE4 which is accumulated temporarily in the internal capacitor of the CDS circuit 903 is input to the output amplifier AMP1, amplified to a predetermined voltage and output to the outside. That is, the signal for focus detection read from the pixel P(2,4) for focus detection is output to the outside from the horizontal output circuit 904.

Next, when the timing signal DV3 for vertical output is given from the vertical scanning circuit 902 to the pixels P(3,1), P(3,2), P(3,3), and P(3,4) in the third row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DV3 for vertical output turns off, the timing signal DHS3 for horizontal output is given from the horizontal scanning circuit 206 for focus detection to the gate of the transistor Tr3 of the horizontal output circuit 904 via the switch SWHS3, and the signal read to the vertical signal line VLINE3 which is accumulated temporarily in the internal capacitor of the CDS circuit 903 is input to the output amplifier AMP1, amplified to a predetermined voltage and output to the outside. That is, the signal for focus detection read from the pixel P(3,3) for focus detection is output to the outside from the horizontal output circuit 904.

In this manner, only the signals for focus detection can be read from the pixels P(1,3), P(2,2), P(2,3), P(2,4), and P(3,3) for focus detection.

[When Reading Image Signals from Image Pixels]

In FIG. 5, the image pixels are pixels P(1,1), P(1,2), P(1,4), P(2,1), P(3,1), P(3,2), P(3,4), P(4,1), P(4,2), P(4,3), and P(4,4). Further, in FIG. 6, in a period of reading image signals, the switches SWHS2 to SWHS4 are in OFF states (open states), and the switches SWHG1 to SWHG4 turn to ON states (closed states).

In this state, first, when the timing signal DV1 for vertical output is given from the vertical scanning circuit 902 to the pixels P(1,1), P(1,2), P(1,3), and P(1,4) in the first row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DV1 for vertical output turns off, a timing signal DHG1 for horizontal output is given from the horizontal image scanning circuit 205 to the gate of the transistor Tr1 of the horizontal output circuit 904 via the switch SWHG1, and the signal read to the vertical signal line VLINE1 which is accumulated temporarily in the internal capacitor of the CDS circuit 903 is input to the output amplifier AMP1, amplified to a predetermined voltage and output to the outside. That is, the signal for focus detection read from the image pixel P(1,1) is output to the outside from the horizontal output circuit 904.

Further, when the timing signal DHG1 for horizontal output turns off, a timing signal DHG2 for horizontal output is given from the horizontal image scanning circuit 205 to the gate of the transistor Tr2 of the horizontal output circuit 904 via the switch SWHG2, and the signal read to the vertical signal line VLINE2 which is accumulated temporarily in the internal capacitor of the CDS circuit 903 is input to the output amplifier AMP1, amplified to a predetermined voltage and output to the outside. That is, the image signal read from the image pixel P(1,2) is output to the outside from the horizontal output circuit 904.

Furthermore, when the timing signal DHG2 for horizontal output turns off, a timing signal DHG4 for horizontal output is given from the horizontal image scanning circuit 205 to the gate of the transistor Tr4 of the horizontal output circuit 904 via the switch SWHG4, and the signal read to the vertical signal line VLINE4 which is accumulated temporarily in the internal capacitor of the CDS circuit 903 is input to the output amplifier AMP1, amplified to a predetermined voltage and output to the outside. That is, the image signal read from the image pixel P(1,4) is output to the outside from the horizontal output circuit 904.

In this manner, the image signals are read from the image pixels P(1,1), P(1,2) and P(1,4) in the first row.

Next, when the timing signal DV2 for vertical output is given from the vertical scanning circuit 902 to the pixels P(2,1), P(2,2), P(2,3), and P(2,4) in the second row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DV2 for vertical output turns off, the timing signal DHG1 for horizontal output is given from the horizontal image scanning circuit 205 to the gate of the transistor Tr1 of the horizontal output circuit 904 via the switch SWHG1, and the signal read to the vertical signal line VLINE1 which is accumulated temporarily in the internal capacitor of the CDS circuit 903 is input to the output amplifier AMP1, amplified to a predetermined voltage and output to the outside. That is, the image signal read from the image pixel P(2,1) is output to the outside from the horizontal output circuit 904.

In this manner, the image signal is read from the image pixel P(2,1) in the second row.

Next, when the timing signal DV3 for vertical output is given from the vertical scanning circuit 902 to the pixels P(3,1), P(3,2), P(3,3), and P(3,4) in the third row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DV3 for vertical output turns off, the timing signal DHG1 for horizontal output is given from the horizontal image scanning circuit 205 to the gate of the transistor Tr1 of the horizontal output circuit 904 via the switch SWHG1, and the signal read to the vertical signal line VLINE1 which is accumulated temporarily in the internal capacitor of the CDS circuit 903 is input to the output amplifier AMP1, amplified to a predetermined voltage and output to the outside. That is, the image signal read from the image pixel P(3,1) is output to the outside from the horizontal output circuit 904.

Further, when the timing signal DHG1 for horizontal output turns off, the timing signal DHG2 for horizontal output is given from the horizontal image scanning circuit 205 to the gate of the transistor Tr2 of the horizontal output circuit 904 via the switch SWHG2, and the signal read to the vertical signal line VLINE2 which is accumulated temporarily in the internal capacitor of the CDS circuit 903 is input to the output amplifier AMP1, amplified to a predetermined voltage and output to the outside. That is, the image signal read from the image pixel P(3,2) is output to the outside from the horizontal output circuit 904.

Furthermore, when the timing signal DHG2 for horizontal output turns off, the timing signal DHG4 for horizontal output is given from the horizontal image scanning circuit 205 to the gate of the transistor Tr4 of the horizontal output circuit 904 via the switch SWHG4, and the signal read to the vertical signal line VLINE4 which is accumulated temporarily in the internal capacitor of the CDS circuit 903 is input to the output amplifier AMP1, amplified to a predetermined voltage and output to the outside. That is, the image signal read from the image pixel P(3,4) is output to the outside from the horizontal output circuit 904.

In this manner, the image signals are read from the image pixels P(3,1), P(3,2), and P(3,4) in the third row.

Next, when the timing signal DV4 for vertical output is given from the vertical scanning circuit 902 to the pixels P(4,1), P(4,2), P(4,3), and P(4,4) in the fourth row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DV4 for vertical output turns off, the timing signal DHG1 for horizontal output is given from the horizontal image scanning circuit 205 to the gate of the transistor Tr1 of the horizontal output circuit 904 via the switch SWHG1, and the signal read to the vertical signal line VLINE1 which is accumulated temporarily in the internal capacitor of the CDS circuit 903 is input to the output amplifier AMP1, amplified to a predetermined voltage and output to the outside. That is, the image signal read from the image pixel P(4,1) is output to the outside from the horizontal output circuit 904.

Further, when the timing signal DHG1 for horizontal output turns off, the timing signal DHG2 for horizontal output is given from the horizontal image scanning circuit 205 to the gate of the transistor Tr2 of the horizontal output circuit 904 via the switch SWHG2, and the signal read to the vertical signal line VLINE2 which is accumulated temporarily in the internal capacitor of the CDS circuit 903 is input to the output amplifier AMP1, amplified to a predetermined voltage and output to the outside. That is, the image signal read from the image pixel P(4,2) is output to the outside from the horizontal output circuit 904.

Furthermore, when the timing signal DHG2 for horizontal output turns off, the timing signal DHG3 for horizontal output is given from the horizontal image scanning circuit 205 to the gate of the transistor Tr3 of the horizontal output circuit 904 via the switch SWHG4, and the signal read to the vertical signal line VLINE3 which is accumulated temporarily in the internal capacitor of the CDS circuit 903 is input to the output amplifier AMP1, amplified to a predetermined voltage and output to the outside. That is, the image signal read from the image pixel P(4,3) is output to the outside from the horizontal output circuit 904.

Furthermore, when the timing signal DHG3 for horizontal output turns off, the timing signal DHG4 for horizontal output is given from the horizontal image scanning circuit 205 to the gate of the transistor Tr4 of the horizontal output circuit 904 via the switch SWHG4, and the signal read to the vertical signal line VLINE4 which is accumulated temporarily in the internal capacitor of the CDS circuit 903 is input to the output amplifier AMP1, amplified to a predetermined voltage and output to the outside. That is, the image signal read from the image pixel P(4,4) is output to the outside from the horizontal output circuit 904.

In this manner, the image signals are read from the image pixels P(4,1), P(4,2), P(4,3), and P(4,4) in the fourth row.

As above, only the image signals can be read from the image pixels P(1,1), P(1,2), P(1,4), P(2,1), P(3,1), P(3,2), P(3,4), P(4,1), P(4,2), P(4,3), and P(4,4).

Thus, in the solid-state image device 201 according to this embodiment, the horizontal image scanning circuit 205 for reading image signals and the scanning circuit 206 for focus detection for reading signals for focus detection are provided separately. By switching these circuits with the switches SWHG1 to SWHG4 and the switches SWHS2 to SWHS4, only image signals can be read from the image pixels and output to the outside, and also only signals for focus detection can be read from the pixels for focus detection and output to the outside.

Further, the pixels for focus detection may be read as image signals, which then may be subjected to correction and used as image data. Alternatively, it is also possible to perform reading only, and not to use the signals of these pixels. In this case, it is just necessary to change whether or not to output pulses of the timing signals DHG2 to DHG4 for horizontal output.

Third Embodiment

Next, a solid-state image device 301 according to a third embodiment will be explained using FIG. 7. The solid-state image device 301 has pixels P(1,1) to P(4,4) in four rows and four columns, a vertical image scanning circuit 302, a vertical scanning circuit 303 of column direction for focus detection, a vertical scanning circuit 304 of row direction for focus detection, a CDS circuit 903, a horizontal output circuit 904, a horizontal image scanning circuit 205, a horizontal scanning circuit 306 of column direction for focus detection, a horizontal scanning circuit 307 of row direction for focus detection, switches SWHG1 to SWHG4, a switch SWHR3, a switch SWHL2, and a switch SWHL4.

Here, the CDS circuit 903 and the horizontal output circuit 904 having the same numerals as in FIG. 9 are identical to those in FIG. 9. Further, the horizontal image scanning circuit 205 having the same numeral as in FIG. 5 of the second embodiment is identical to that in FIG. 5. Note that the pixels P(1,3), P(2,2), P(2,3), P(2,4), and P(3,3) shown by hatching indicate pixels for focus detection similarly to FIG. 5, and the pixels other than these pixels are image pixels.

Figure 7:
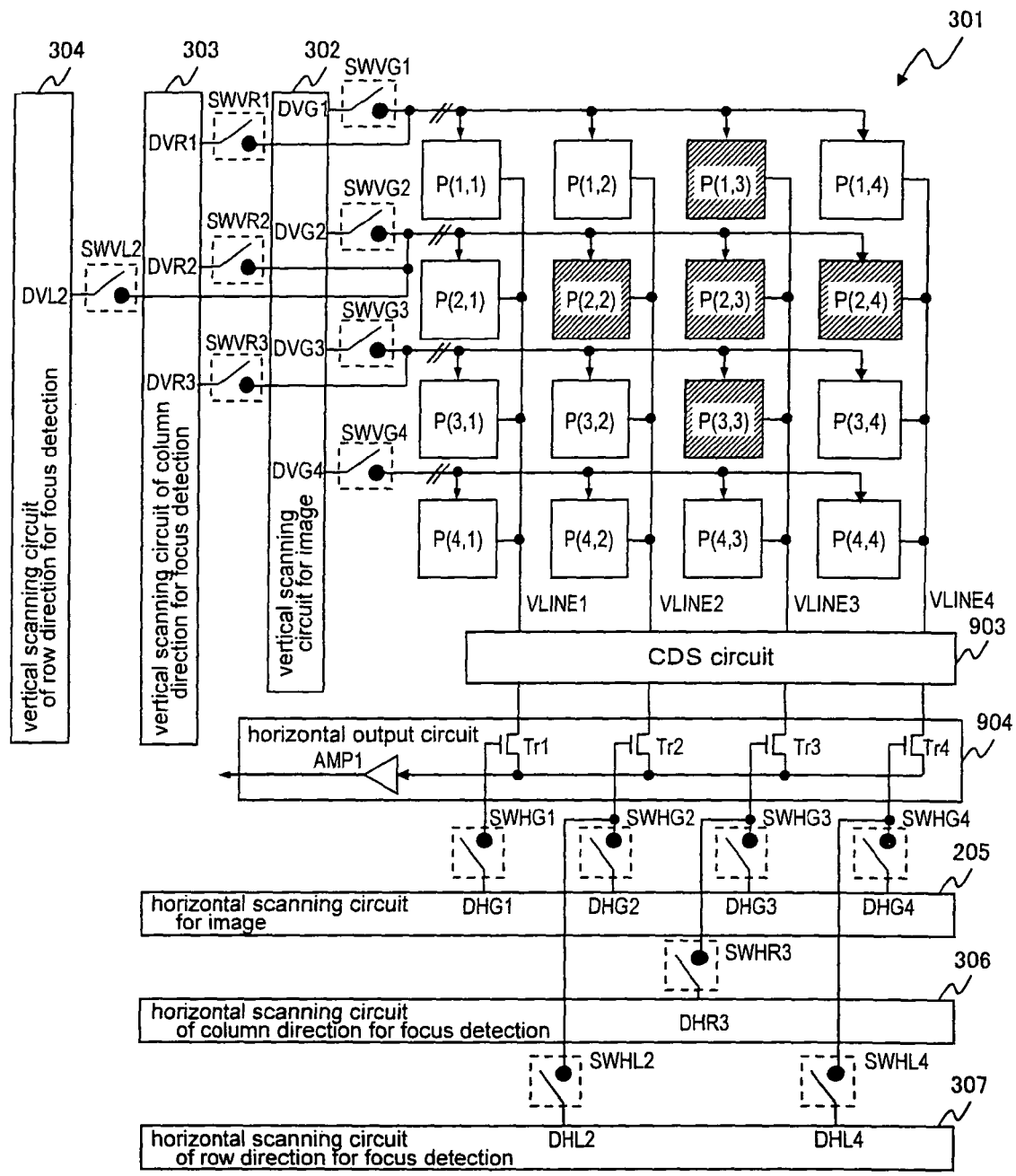
FIG. 7 is a block diagram of a solid-state image device 301 according to a third embodiment.

In FIG. 7, the operation of a part in which signals read from respective pixels via the vertical signal lines VLINE1 to VLINE4 are accumulated temporarily in the internal capacitors of the CDS circuit 903 is the same as in FIG. 9 except timing signals for vertical output given from the vertical scanning circuit 902.

Next, timing signals for vertical output of this embodiment will be explained. In this embodiment, timing signals DVG1 to DVG4 for vertical output when reading image signals to the vertical signal lines VLINE1 to VLINE4 are given from the vertical image scanning circuit 302 via switches SWVG1 to SWVG4. Further, timing signals DVR1 to DVR3 for'vertical output when reading signals for focus detection in the column direction are given from the vertical scanning circuit 303 of column direction for focus detection via switches SWVR1 to SWVR3. Furthermore, a timing signal DVL2 for vertical output when reading a signal for focus detection in the row direction is given from the vertical scanning circuit 304 of row direction for focus detection via a switch SWVL2.

Further, when outputting image signals accumulated in the CDS circuit 903 in the horizontal direction column by column, timing signals DHG1 to DHG4 for horizontal output are given from the horizontal image scanning circuit 205 to the gates of the transistors Tr1 to Tr4 of the horizontal output circuit 904 via the switch SWHG1, the switch SWHG2, the switch SWHG3, and the switch SWHG4.

On the other hand, when outputting in the horizontal direction the signals for focus detection of the pixels for focus detection allocated in the column direction which are accumulated in the CDS circuit 903, a timing signal DHR3 for horizontal output is given to the transistor Tr3 of the horizontal output circuit 904 from the horizontal scanning circuit 306 of column direction for focus detection via the switch SWHR3. Further, when outputting in the horizontal direction the signals for focus detection of the pixels for focus detection allocated in the row direction which are accumulated in the CDS circuit 903, timing signals DHL2 and DHL4 for horizontal output are given to the transistors Tr2 and Tr4 of the horizontal output circuit 904 from the horizontal scanning circuit 307 of row direction for focus detection via the switches SWHL2 and SWHL4.

Figure 8:
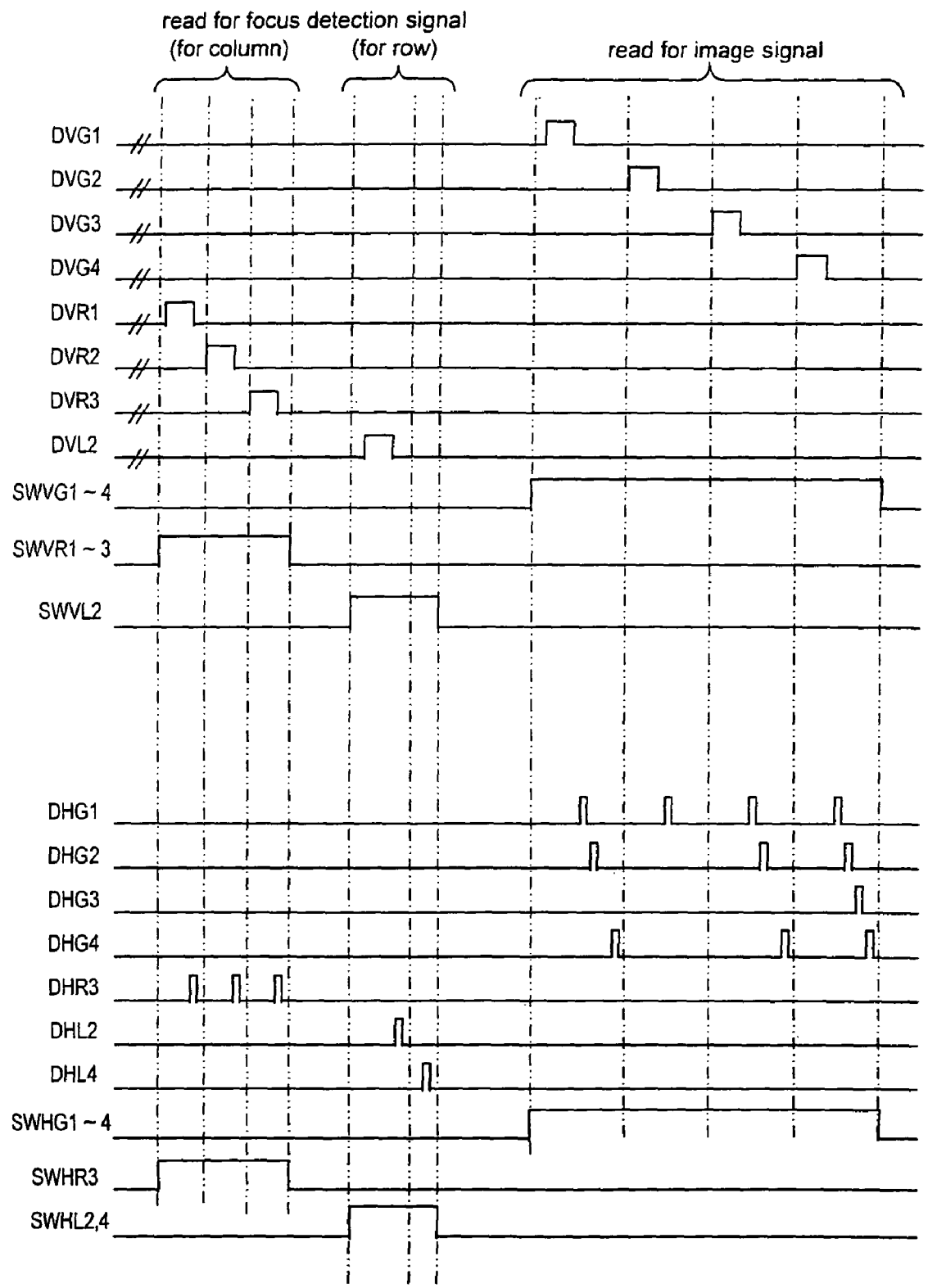
FIG. 8 is a timing chart of the solid-state image device 301 according to the third embodiment.

Hereinafter, timings for reading signals for focus detection and timings for reading image signals in the solid-state image device 301 according to this embodiment will be explained in order using FIG. 8.

[When Reading Signals for Focus Detection from Pixels for Focus Detection in the Column Direction]

In FIG. 7, the pixels for focus detection in the column direction are pixels P(1,3), P(2,3), P(3,3). Further, in FIG. 8, during a period of reading signals for focus detection in the column direction, the switches SWVR1 to SWVR3 and the switch SWHR3 turn to ON states (closed states), and the switches SWVG1 to SWVG4, the switch SWVL2, the switches SWHG1 to SWHG4, the switch SWHL2, and the switch SWHL4 are in OFF states (open states).

In this state, first, when the timing signal DVR1 for vertical output is given from the vertical scanning circuit 303 of column direction for focus detection to the pixels P(1,1), P(1,2), P(1,3), and P(1,4) in the first row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DVR1 for vertical output turns off, a timing signal DHR3 for horizontal output is given from the horizontal scanning circuit 306 of column direction for focus detection to the gate of the transistor Tr3 of the horizontal output circuit 904 via the switch SWHR3, and the signal read to the vertical signal line VLINE3 which is accumulated temporarily in the internal capacitor of the CDS circuit 903 is input to the output amplifier AMP1, amplified to a predetermined voltage and output to the outside. That is, the signal for focus detection read from the pixel P(1,3) for focus detection is output to the outside from the horizontal output circuit 904.

Next, when the timing signal DVR2 for vertical output is given from the vertical scanning circuit 303 of column direction for focus detection to the pixels P(2,1), P(2,2), P(2,3), and P(2,4) in the second row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DVR2 for vertical output turns off, the timing signal DHR3 for horizontal output is given from the horizontal scanning circuit 306 of column direction for focus detection to the gate of the transistor Tr3 of the horizontal output circuit 904 via the switch SWHR3, and the signal read to the vertical signal line VLINE3 which is accumulated temporarily in the internal capacitor of the CDS circuit 903 is input to the output amplifier AMP1, amplified to a predetermined voltage and output to the outside. That is, the signal for focus detection read from the pixel P(2,3) for focus detection is output to the outside from the horizontal output circuit 904.

Next, when the timing signal DVR3 for vertical output is given from the vertical scanning circuit 303 of column direction for focus detection to the pixels P(3,1), P(3,2), P(3,3), and P(3,4) in the third row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DVR3 for vertical output turns off, the timing signal DHR3 for horizontal output is given from the horizontal scanning circuit 306 of column direction for focus detection to the gate of the transistor Tr3 of the horizontal output circuit 904 via the switch SWHR3, and the signal read to the vertical signal line VLINE3 which is accumulated temporarily in the internal capacitor of the CDS circuit 903 is input to the output amplifier AMP1, amplified to a predetermined voltage and output to the outside. That is, the signal for focus detection read from the pixel P(3,3) for focus detection is output to the outside from the horizontal output circuit 904.

In this manner, only the signals for focus detection can be read from the pixels P(1,3), P(2,3), and P(3,3) for focus detection in the column direction.

[When Reading Signals for Focus Detection from Pixels for Focus Detection in the Row Direction]

In FIG. 7, the pixels for focus detection in the row direction are pixels P(2,2), P(2,4). Note that the pixel P(2,3) may be used as a pixel for focus detection in the row direction, but in this embodiment, the pixel P(2,3) is a pixel for focus detection in the column direction. Further, in FIG. 8, during a period of reading signals for focus detection in the row direction, the switches SWVR1 to SWVR3, the switches SWVG1 to SWVG4, the switches SWHG1 to SWHG4, and the switch SWHR3 are in OFF states (open states), and the switch SWVL2, the switch SWHL2, and the switch SWHL4 turn to ON states (closed states).

In this state, first, when the timing signal DVL2 for vertical output is given from the vertical scanning circuit 304 of row direction for focus detection to the pixels P(2,1), P(2,2), P(2,3), and P(2,4) in the second row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DVL2 for vertical output turns off, the timing signal DHL2 for horizontal output is given from the horizontal scanning circuit 307 of row direction for focus detection to the gate of the transistor Tr2 of the horizontal output circuit 904 via the switch SWHL2, and the signal read to the vertical signal line VLINE2 which is accumulated temporarily in the internal capacitor of the CDS circuit 903 is input to the output amplifier AMP1, amplified to a predetermined voltage and output to the outside. That is, the signal for focus detection read from the pixel P(2,2) for focus detection is output to the outside from the horizontal output circuit 904.

Next, when the timing signal DHL2 for horizontal output turns off, the timing signal DHL4 for horizontal output is given from the horizontal scanning circuit 307 of row direction for focus detection to the gate of the transistor Tr4 of the horizontal output circuit 904 via the switch SWHL4, and the signal read to the vertical signal line VLINE4 which is accumulated temporarily in the internal capacitor of the CDS circuit 903 is input to the output amplifier AMP1, amplified to a predetermined voltage and output to the outside. That is, the signal for focus detection read from the pixel P(2,4) for focus detection is output to the outside from the horizontal output circuit 904.

In this manner, only the signals for focus detection can be read from the pixels P(2,2) and P(2,4) for focus detection in the row direction.

[When Reading Image Signals from Image Pixels]

In FIG. 7, the image pixels are pixels P(1,1), P(1,2), P(1,4), P(2,1), P(3,1), P(3,2), P(3,4), P(4,1), P(4,2), P(4,3), and P(4,4). Further, in FIG. 8, in a period of reading image signals, the switches SWVR1 to SWVR3, the switch SWVL2, the switch SWHR3, the switch SWHL2, and the switch SWHL4 are in OFF states (open states), and the switches SWVG1 to SWVG4 and the switches SWHG1 to SWHG4 turn to ON states (closed states).

In this state, first, when the timing signal DVG1 for vertical output is given from the vertical image scanning circuit 302 to the pixels P(1,1), P(1,2), P(1,3), and P(1,4) in the first row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DVG1 for vertical output turns off, the timing signal DHG1 for horizontal output is given from the horizontal image scanning circuit 205 to the gate of the transistor Tr1 of the horizontal output circuit 904 via the switch SWHG1, and the signal read to the vertical signal line VLINE1 which is accumulated temporarily in the internal capacitor of the CDS circuit 903 is input to the output amplifier AMP1, amplified to a predetermined voltage and output to the outside. That is, the signal for focus detection read from the image pixel P(1,1) is output to the outside from the horizontal output circuit 904.

Further, when the timing signal DHG1 for horizontal output turns off, the timing signal DHG2 for horizontal output is given from the horizontal image scanning circuit 205 to the gate of the transistor Tr2 of the horizontal output circuit 904 via the switch SWHG2, and the signal read to the vertical signal line VLINE2 which is accumulated temporarily in the internal capacitor of the CDS circuit 903 is input to the output amplifier AMP1, amplified to a predetermined voltage and output to the outside. That is, the image signal read from the image pixel P(1,2) is output to the outside from the horizontal output circuit 904.

Furthermore, when the timing signal DHG2 for horizontal output turns off, the timing signal DHG4 for horizontal output is given from the horizontal image scanning circuit 205 to the gate of the transistor Tr4 of the horizontal output circuit 904 via the switch SWHG4, and the signal read to the vertical signal line VLINE4 which is accumulated temporarily in the internal capacitor of the CDS circuit 903 is input to the output amplifier AMP1, amplified to a predetermined voltage and output to the outside. That is, the image signal read from the image pixel P(1,4) is output to the outside from the horizontal output circuit 904.

In this manner, the image signals are read from the image pixels P(1,1), P(1,2), and P(1,4) in the first row.

Next, when the timing signal DVG2 for vertical output is given from the vertical scanning circuit 902 to the pixels P(2,1), P(2,2), P(2,3), and P(2,4) in the second row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DVG2 for vertical output turns off, the timing signal DHG1 for horizontal output is given from the horizontal image scanning circuit 205 to the gate of the transistor Tr1 of the horizontal output circuit 904 via the switch SWHG1, and the signal read to the vertical signal line VLINE1 which is accumulated temporarily in the internal capacitor of the CDS circuit 903 is input to the output amplifier AMP1, amplified to a predetermined voltage and output to the outside. That is, the image signal read from the image pixel P(2,1) is output to the outside from the horizontal output circuit 904.

In this manner, the image signal is read from the image pixel P(2,1) in the second row.

Next, when the timing signal DVG3 for vertical output is given from the vertical scanning circuit 902 to the pixels P(3,1), P(3,2), P(3,3), and P(3,4) in the third row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DVG3 for vertical output turns off, the timing signal DHG1 for horizontal output is given from the horizontal image scanning circuit 205 to the gate of the transistor Tr1 of the horizontal output circuit 904 via the switch SWHG1, and the signal read to the vertical signal line VLINE1 which is accumulated temporarily in the internal capacitor of the CDS circuit 903 is input to the output amplifier AMP1, amplified to a predetermined voltage and output to the outside. That is, the image signal read from the image pixel P(3,1) is output to the outside from the horizontal output circuit 904.

Further, when the timing signal DHG1 for horizontal output turns off, the timing signal DHG2 for horizontal output is given from the horizontal image scanning circuit 205 to the gate of the transistor Tr2 of the horizontal output circuit 904 via the switch SWHG2, and the signal read to the vertical signal line VLINE2 which is accumulated temporarily in the internal capacitor of the CDS circuit 903 is input to the output amplifier AMP1, amplified to a predetermined voltage and output to the outside. That is, the image signal read from the image pixel P(3,2) is output to the outside from the horizontal output circuit 904.

Furthermore, when the timing signal DHG2 for horizontal output turns off, the timing signal DHG4 for horizontal output is given from the horizontal image scanning circuit 205 to the gate of the transistor Tr4 of the horizontal output circuit 904 via the switch SWHG4, and the signal read to the vertical signal line VLINE4 which is accumulated temporarily in the internal capacitor of the CDS circuit 903 is input to the output amplifier AMP1, amplified to a predetermined voltage and output to the outside. That is, the image signal read from the image pixel P(3,4) is output to the outside from the horizontal output circuit 904.

In this manner, the image signals are read from the image pixels P(3,1), P(3,2), and P(3,4) in the third row.

Next, when the timing signal DVG4 for vertical output is given from the vertical scanning circuit 902 to the pixels P(4,1), P(4,2), P(4,3), and P(4,4) in the fourth row, signals from pixels or signals for focus detection are read from these pixels to the vertical signal lines VLINE1 to VLINE4, and the signals from pixels or the signals for focus detection of one row are accumulated temporarily in the internal capacitors of the CDS circuit 903.

Here, when the timing signal DVG4 for vertical output turns off, the timing signal DHG1 for horizontal output is given from the horizontal image scanning circuit 205 to the gate of the transistor Tr1 of the horizontal output circuit 904 via the switch SWHG1, and the signal read to the vertical signal line VLINE1 which is accumulated temporarily in the internal capacitor of the CDS circuit 903 is input to the output amplifier AMP1, amplified to a predetermined voltage and output to the outside. That is, the image signal read from the image pixel P(4,1) is output to the outside from the horizontal output circuit 904.

Further, when the timing signal DHG1 for horizontal output turns off, the timing signal DHG2 for horizontal output is given from the horizontal image scanning circuit 205 to the gate of the transistor Tr2 of the horizontal output circuit 904 via the switch SWHG2, and the signal read to the vertical signal line VLINE2 which is accumulated temporarily in the internal capacitor of the CDS circuit 903 is input to the output amplifier AMP1, amplified to a predetermined voltage and output to the outside. That is, the image signal read from the image pixel P(4,2) is output to the outside from the horizontal output circuit 904.

Furthermore, when the timing signal DHG2 for horizontal output turns off, the timing signal DHG3 for horizontal output is given from the horizontal image scanning circuit 205 to the gate of the transistor Tr3 of the horizontal output circuit 904 via the switch SWHG4, and the signal read to the vertical signal line VLINE3 which is accumulated temporarily in the internal capacitor of the CDS circuit 903 is input to the output amplifier AMP1, amplified to a predetermined voltage and output to the outside. That is, the image signal read from the image pixel P(4,3) is output to the outside from the horizontal output circuit 904.

Furthermore, when the timing signal DHG3 for horizontal output turns off, the timing signal DHG4 for horizontal output is given from the horizontal image scanning circuit 205 to the gate of the transistor Tr4 of the horizontal output circuit 904 via the switch SWHG4, and the signal read to the vertical signal line VLINE4 which is accumulated temporarily in the internal capacitor of the CDS circuit 903 is input to the output amplifier AMP1, amplified to a predetermined voltage and output to the outside. That is, the image signal read from the image pixel P(4,4) is output to the outside from the horizontal output circuit 904.

In this manner, the image signals are read from the image pixels P(4,1), P(4,2), P(4,3), and P(4,4) in the fourth row.

As above, only the image signals can be read from the image pixels P(1,1), P(1,2), P(1,4), P(2,1), P(3,1), P(3,2), P(3,4), P(4,1), P(4,2), P(4,3), and P(4,4).

Further, the pixels for focus detection may be read as image signals, which then may be subjected to correction and used as image data. Alternatively, it is also possible to perform reading only, and not to use the signals of these pixels. In this case, it is just necessary to change whether or not to output pulses of the timing signals DHG2 to DHG4 for horizontal output.

Thus, in the solid-state image device 301 according to this embodiment, there are provided the vertical image scanning circuit 302 and the horizontal image scanning circuit 205 which are for reading image signals, the vertical scanning circuit 303 of column direction for focus detection and the horizontal scanning circuit 306 of column direction for focus detection, which are for reading signals for focus detection in the column direction, and the vertical scanning circuit 304 of row direction for focus detection and the horizontal scanning circuit 307 of row direction for focus detection, which are for reading signals for focus detection in the row direction. By switching these circuits with the switches SWHG1 to SWHG4, the switch SWHR3, the switch SWHL2, the switch SWHL4, the switches SWVG1 to SWVG4, the switches SWVR1 to SWVR3, and the switch SWVL2, only image signals can be read from the image pixels and output to the outside. Moreover, only signals for focus detection in the column direction can be read from the pixels of column direction for focus detection and output to the outside, and only signals for focus detection in the row direction can be read from the pixels of row direction for focus detection and output to the outside.

As has been explained above with the embodiments, in the solid-state image device according to the present invention, the signal lines, output circuits and scanning circuits for reading image signals from the image pixels, and the signals lines, output circuits and scanning circuits for reading signals for focus detection from the pixels for focus detection are provided separately. Thus, it becomes possible to read signals for focus detection quickly without being affected by a reading time of image signals. Alternatively, scanning circuits for reading image signals and scanning circuits for reading signals for focus detection are provided separately, and the signals for focus detection can be read quickly by switching these circuits.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A solid-state image device having a photoelectric conversion part converting an incident light into an electric signal and having focus detection pixels and image pixels which are allocated in a two dimensional matrix in a row direction and a column direction, the solid-state device comprising:

an image scanning circuit that reads image signals from said image pixels to an image output circuit via image signal lines and that outputs the image signals read to said image output circuit; and a focus detection scanning circuit that reads focus detection signals from said focus detection pixels to a focus detection output circuit via focus detection signal lines, and that outputs the focus detection signals read to said focus detection output circuit, wherein the solid-state image device independently performs an operation in which said image scanning circuit reads out the signals of said image pixels to said image output circuit, and an operation in which said focus detection scanning circuit reads out the signals or said for focus detection pixels to said focus detection output circuit, wherein:

said image scanning circuit includes a vertical image scanning circuit which selects a row including said image pixels and reads the image signals from said image pixels to a horizontal image output circuit via vertical image signal lines, and a horizontal image scanning circuit which outputs in a horizontal direction the image signals of one row read to said horizontal image output circuit; and said focus detection scanning circuit includes a horizontal focus detection scanning circuit that selects a column including said focus detection pixels and reads the focus detection signals from said focus detection pixels to a vertical focus detection output circuit via horizontal focus detection signal lines, and a vertical focus detection scanning circuit which outputs the focus detection signals in a vertical direction of one column read to said vertical focus detection output circuit, in which an operation of reading out the signals of said image pixels to said horizontal image output circuit by said vertical image scanning circuit and an operation of reading out the signals of said focus detection pixels to said vertical focus detection output circuit by said horizontal focus detection scanning circuit are performed independently.

2. A solid-state image device having a photoelectric conversion part converting an incident light into an electric signal and having focus detection pixels and image pixels which are allocated in a two dimensional matrix in a row direction and a column direction, the solid-state image device comprising:
- a vertical image scanning circuit that selects a row including said image pixels and outputs image signals from said image pixels to a horizontal output circuit via vertical signal lines;
- a horizontal image scanning circuit that selects a column including said image pixels and that outputs the image signals in a horizontal direction from said horizontal output circuit;
- a horizontal focus detection scanning circuit that selects a column including said focus detection pixels and that outputs focus detection signals in the horizontal direction from said horizontal output circuit; and
- a horizontal scanning selection circuit that switches between said horizontal image scanning circuit and said horizontal focus detection scanning circuit, wherein
- the image signals of said image pixels and the focus detection signals of said focus detection pixels are respectively and independently read out by said horizontal image scanning circuit and by said horizontal focus detection scanning circuit from said horizontal output circuit.

3. A solid-state image device having a photoelectric conversion part converting an incident light into an electric signal and having focus detection pixels and image pixels which are allocated in a two dimensional matrix in a row direction and a column direction, the solid-state image device comprising:
- a vertical image scanning circuit that selects a row including said image pixels and that outputs image signals from said image pixels to a horizontal output circuit via vertical signal lines;
- a horizontal image scanning circuit that selects a column including said image pixels and that outputs the image signals in a horizontal direction from said horizontal output circuit;
- a vertical focus detection scanning circuit for the column direction that selects a row including said focus detection pixels in the column direction and that outputs focus detection signals from said focus detection pixels to said horizontal output circuit via the vertical signal lines;
- a horizontal focus detection scanning circuit for the column direction that selects a column including said focus detection pixels in said column direction and that outputs the focus detection signals from said horizontal output circuit in the horizontal direction;
- a vertical focus detection scanning circuit for the row direction that selects a row including said focus detection pixels in the row direction and that outputs the focus detection signals from said focus detection pixels to said horizontal output circuit via the vertical signal lines;
- a horizontal focus detection scanning circuit for the row direction that selects a column including said focus detection pixels in said row direction and that outputs the focus detection signals from said horizontal output circuit in the horizontal direction;
- a vertical scanning selection circuit that switches among said vertical focus detection scanning circuit for the row direction, said vertical focus detection scanning circuit for the column direction, and said vertical image scanning circuit; and
- a horizontal scanning selection circuit that switches among said horizontal focus detection scanning circuit for the row direction, said horizontal focus detection scanning circuit for the column direction, and said horizontal image scanning circuit, wherein
- the signals of said image pixels are read out to said horizontal output circuit by said vertical image scanning circuit, and the signals of said focus detection pixels are read out to said horizontal output circuit by one of said vertical focus detection scanning circuit for the column direction and said vertical focus detection scanning circuit for the row direction, independently, and
- the signals of said image pixels being read out to said horizontal output circuit are read out from said horizontal output circuit by said horizontal image scanning circuit, and the signals of said focus detection pixels being read out to said horizontal output circuit are read out from said horizontal output circuit by one of said horizontal focus detection scanning circuit for the column direction and said horizontal focus detection scanning circuit for the row direction, independently.

* * * * *

UNITED STATES PATENT AND TRADEMARK OFFICE
CERTIFICATE OF CORRECTION

| | | |
|---|---|---|
| PATENT NO. | : 8,102,463 B2 | Page 1 of 1 |
| APPLICATION NO. | : 12/285109 | |
| DATED | : January 24, 2012 | |
| INVENTOR(S) | : Takafumi Komaba et al. | |

It is certified that error appears in the above-identified patent and that said Letters Patent is hereby corrected as shown below:

On the title page, item 73 should read:

(73) Assignee: Nikon Corporation, Tokyo (JP)

Signed and Sealed this
Twenty-second Day of May, 2012

David J. Kappos
*Director of the United States Patent and Trademark Office*